(12) United States Patent  
Ghantous et al.

(10) Patent No.: US 9,063,018 B1
(45) Date of Patent: Jun. 23, 2015

(54) METHOD AND CIRCUITRY TO DETERMINE TEMPERATURE AND/OR STATE OF HEALTH OF A BATTERY/CELL

(71) Applicant: Qnovo Inc., Newark, CA (US)

(72) Inventors: Dania Ghantous, Walnut Creek, CA (US); Fred Berkowitz, Los Gatos, CA (US); Christina Peabody, Fremont, CA (US); Nadim Maluf, Los Altos, CA (US)

(73) Assignee: Qnovo Inc., Newark, CA (US)

( * ) Notice: Subject to any disclaimer, the term of this patent is extended or adjusted under 35 U.S.C. 154(b) by 301 days.

(21) Appl. No.: 13/657,841

(22) Filed: Oct. 22, 2012

(51) Int. Cl.
  *G01K 13/00* (2006.01)
  *G01K 15/00* (2006.01)
  *G01K 1/14* (2006.01)

(52) U.S. Cl.
  CPC . *G01K 1/14* (2013.01); *G01K 15/00* (2013.01)

(58) Field of Classification Search
  USPC .............................. 374/1, 152, 141; 320/150
  See application file for complete search history.

(56) References Cited

U.S. PATENT DOCUMENTS

| | | | |
|---|---|---|---|
| 4,829,225 A | 5/1989 | Podrazhansky et al. | |
| 5,410,238 A | 4/1995 | Ishizuka et al. | |
| 5,684,386 A | 11/1997 | Okada | |
| 5,808,447 A | 9/1998 | Hagino | |
| 5,888,665 A | 3/1999 | Bugga et al. | |
| 5,905,364 A | 5/1999 | Ookita | |
| 5,982,152 A | 11/1999 | Watanabe et al. | |
| 6,040,685 A | 3/2000 | Tsenter et al. | |
| 6,043,631 A | 3/2000 | Tsenter | |
| 6,074,771 A | 6/2000 | Cubukcu et al. | |
| 6,094,033 A | 7/2000 | Ding et al. | |
| 6,097,172 A | 8/2000 | Podrazhansky et al. | |
| 6,127,804 A | 10/2000 | Oglesbee et al. | |
| 6,127,809 A | 10/2000 | Kates et al. | |

(Continued)

FOREIGN PATENT DOCUMENTS

| | | |
|---|---|---|
| EP | 01 912 163 | 3/2001 |
| WO | WO 00/13288 | 3/2000 |

(Continued)

OTHER PUBLICATIONS

U.S. Appl. No. 61/044,160, filed Apr. 2008, Greening et al.

(Continued)

*Primary Examiner* — Mirellys Jagan
(74) *Attorney, Agent, or Firm* — Weaver Austin Villeneuve & Sampson LLP

(57) ABSTRACT

Techniques and circuitry, in one embodiment, determine a temperature of a battery by applying a calibration packet to the battery's terminals and at the battery's first SOC, wherein the calibration packet includes a first pulse (charge or discharge) which temporally precedes a rest period. In one embodiment, measurement circuitry measures a first terminal voltage at a time immediately prior to or at a beginning of the first pulse of the calibration packet, and a second terminal voltage, in response to the calibration packet, at a time during the partial relaxation time period of a battery. Control circuitry determines a partial relaxation time voltage ($V_{PRT}$) at the battery's first SOC using the first and second terminal voltages and determines a temperature of the battery by correlating the $V_{PRT}$ at the first SOC to a temperature of the battery at the battery's current SOH.

10 Claims, 16 Drawing Sheets

(56) References Cited

U.S. PATENT DOCUMENTS

| | | | |
|---|---|---|---|
| 6,137,265 A | 10/2000 | Cummings et al. |
| 6,144,187 A | 11/2000 | Bryson |
| 6,194,867 B1 | 2/2001 | Cummings et al. |
| 6,204,634 B1 | 3/2001 | Zimmerman et al. |
| 6,215,281 B1 | 4/2001 | Koch |
| 6,262,577 B1 | 7/2001 | Nakao et al. |
| 6,307,353 B1 | 10/2001 | Shiojima |
| 6,313,605 B1 | 11/2001 | Tsenter |
| 6,362,598 B2 | 3/2002 | Laig-Horstebrock et al. |
| 6,366,056 B1 | 4/2002 | Podrazhansky et al. |
| 6,377,028 B1 | 4/2002 | Armstrong, II et al. |
| 6,441,586 B1 | 8/2002 | Tate, Jr. et al. |
| 6,469,471 B1 | 10/2002 | Anbuky et al. |
| 6,532,425 B1 | 3/2003 | Boost et al. |
| 6,630,814 B2 | 10/2003 | Ptasinski et al. |
| 6,631,293 B2 | 10/2003 | Lyden |
| 6,646,419 B1 | 11/2003 | Ying |
| 6,707,272 B1 | 3/2004 | Thandiwe |
| 6,789,026 B2 | 9/2004 | Barsoukov et al. |
| 6,832,171 B2 | 12/2004 | Barsoukov et al. |
| 6,833,686 B2 | 12/2004 | Veselic et al. |
| 6,841,974 B2 | 1/2005 | Dykeman |
| 6,892,148 B2 | 5/2005 | Barsoukov et al. |
| 6,924,622 B1 | 8/2005 | Anbuky et al. |
| 7,005,830 B2 | 2/2006 | Moore et al. |
| 7,034,503 B2 | 4/2006 | Veselic et al. |
| 7,072,871 B1 | 7/2006 | Tinnemeyer |
| 7,180,298 B2 | 2/2007 | Nakamura et al. |
| 7,199,557 B2 | 4/2007 | Anbuky et al. |
| 7,227,336 B1 | 6/2007 | Van Schalkwijk et al. |
| 7,245,107 B2 | 7/2007 | Moore et al. |
| 7,248,023 B2 | 7/2007 | Takezawa et al. |
| 7,324,902 B2 | 1/2008 | Verbrugge et al. |
| 7,362,074 B2 | 4/2008 | Iwane et al. |
| 7,402,980 B2 | 7/2008 | Al-Anbuky et al. |
| 7,492,130 B2 | 2/2009 | Daboussi |
| 7,557,541 B2 | 7/2009 | Marinka-Tóth et al. |
| 7,570,015 B2 | 8/2009 | Bansal et al. |
| 7,595,611 B2 | 9/2009 | Reynier et al. |
| 7,626,394 B2 | 12/2009 | Kimura et al. |
| 7,772,804 B2 | 8/2010 | Bhardwaj et al. |
| 7,788,052 B2 | 8/2010 | Iwane et al. |
| 8,040,106 B2 | 10/2011 | Ishikawa |
| 2002/0070706 A1 | 6/2002 | Champlin |
| 2002/0075003 A1 | 6/2002 | Fridman et al. |
| 2002/0109504 A1 | 8/2002 | Champlin |
| 2002/0117997 A1 | 8/2002 | Feil et al. |
| 2003/0003363 A1 | 1/2003 | Daido et al. |
| 2003/0206021 A1 | 11/2003 | Laletin et al. |
| 2004/0032237 A1 | 2/2004 | Dykeman |
| 2005/0156577 A1 | 7/2005 | Sully |
| 2005/0189948 A1 | 9/2005 | Koch |
| 2005/0194938 A1 | 9/2005 | Sanpei |
| 2005/0214646 A1 | 9/2005 | Kubota |
| 2005/0248314 A1 | 11/2005 | James |
| 2005/0264263 A1 | 12/2005 | Tsenter |
| 2006/0093894 A1 | 5/2006 | Scott et al. |
| 2006/0145658 A1 | 7/2006 | Wang |
| 2006/0186890 A1 | 8/2006 | Iwane et al. |
| 2006/0208701 A1 | 9/2006 | Mikhaylik |
| 2006/0238168 A1 | 10/2006 | Matsuo et al. |
| 2007/0132456 A1 | 6/2007 | Salman et al. |
| 2007/0216359 A1 | 9/2007 | Arai et al. |
| 2007/0236225 A1 | 10/2007 | Tsenter et al. |
| 2007/0257681 A1 | 11/2007 | Christophersen et al. |
| 2008/0003490 A1 | 1/2008 | Christensen et al. |
| 2008/0211459 A1 | 9/2008 | Choi |
| 2009/0027006 A1 | 1/2009 | Vezzini et al. |
| 2009/0027007 A1 | 1/2009 | Iwane et al. |
| 2009/0027056 A1 | 1/2009 | Huang et al. |
| 2009/0195214 A1 | 8/2009 | Gehrke et al. |
| 2009/0212626 A1 | 8/2009 | Snyder et al. |
| 2009/0256528 A1 | 10/2009 | Greening et al. |
| 2009/0259420 A1 | 10/2009 | Greening et al. |
| 2009/0273320 A1 | 11/2009 | Ungar et al. |
| 2009/0325056 A1 | 12/2009 | Greening et al. |
| 2009/0326842 A1 | 12/2009 | Thomas-Alyea |
| 2010/0000809 A1 | 1/2010 | Nishi et al. |
| 2010/0039116 A1 | 2/2010 | Tsenter et al. |
| 2010/0060240 A1 | 3/2010 | Karoui |
| 2010/0066310 A1 | 3/2010 | Biggs, Jr. |
| 2010/0072955 A1 | 3/2010 | Ishikawa |
| 2010/0134305 A1 | 6/2010 | Lu et al. |
| 2010/0164437 A1 | 7/2010 | McKinley et al. |
| 2011/0037439 A1 | 2/2011 | Bhardwaj et al. |
| 2011/0089907 A1 | 4/2011 | Bhardwaj et al. |
| 2011/0285356 A1 | 11/2011 | Maluf et al. |
| 2011/0316548 A1 | 12/2011 | Ghantous et al. |
| 2012/0038325 A1 | 2/2012 | Morita et al. |
| 2012/0200266 A1 | 8/2012 | Berkowitz et al. |
| 2012/0310565 A1* | 12/2012 | Redey .............................. 702/63 |
| 2014/0079969 A1* | 3/2014 | Greening et al. ............... 429/91 |
| 2014/0084846 A1* | 3/2014 | Berkowitz et al. ............. 320/107 |

FOREIGN PATENT DOCUMENTS

| | | |
|---|---|---|
| WO | WO 00/75678 | 12/2000 |
| WO | WO 02/21149 | 3/2002 |
| WO | WO 02/21662 | 3/2002 |
| WO | WO 02/41466 | 5/2002 |
| WO | WO 02/93712 | 11/2002 |
| WO | WO 03/107505 | 12/2003 |
| WO | WO 2004/017485 | 2/2004 |
| WO | WO 2004/109311 | 12/2004 |
| WO | WO 2005/003800 | 1/2005 |
| WO | WO 2005/101042 | 10/2005 |
| WO | WO 2005/114808 | 12/2005 |
| WO | WO 2006/057468 | 6/2006 |
| WO | WO 2007/004098 | 1/2007 |
| WO | WO 2008/117239 | 10/2008 |
| WO | WO 2008/128429 | 10/2008 |
| WO | WO 2009/025944 | 2/2009 |
| WO | WO 2009/126734 | 10/2009 |
| WO | WO 2009/126797 | 10/2009 |
| WO | WO 2010/096180 | 8/2010 |
| WO | WO 2012/135148 | 10/2012 |

OTHER PUBLICATIONS

U.S. Appl. No. 61/089,246, filed Aug. 2008, Greening et al.
"Rapid Charging of Lithium-Ion Batteries using Pulsed Currents", Landau et al., J. of Electrochemical Soc., 153 (3) A533-A542 (2006).
"Reduced Mass Transport Limitations by Application of Special Pulse Current modes", Landau et al., J. of Electrochemical Soc., 152 (4) J33-J39 (2005).
"Intercalation of Lithium Ions into Graphite Electrodes Studied by AC Impedance Measurements", Piao et al., J. of Electrochemical Soc., 146 (8) 2794-98 (1999).
"Lithium Diffusion in Graphitic Carbon", Persson et al, J. Phys. Chem. Letters, 1, 1176-80 (2010).
"A Generalized Cycle Life Model of Rechargeable Lithium-Ion Batteries", Ning et al Electrochimica Acta 51, 2012-2022 (2006).
"Cycle Life Modeling of Lithium-ion Batteries", Ning et al, J. of Electrochemical Soc., 151 (10) A1584-A1591 (2004).
S. Santhanagopalan et al., "Online estimation of the state of charge of a lithium ion cell," Journal of Power Sources, vol. 161 (2006), pp. 1346-1355, Elsevier, B.V.

* cited by examiner

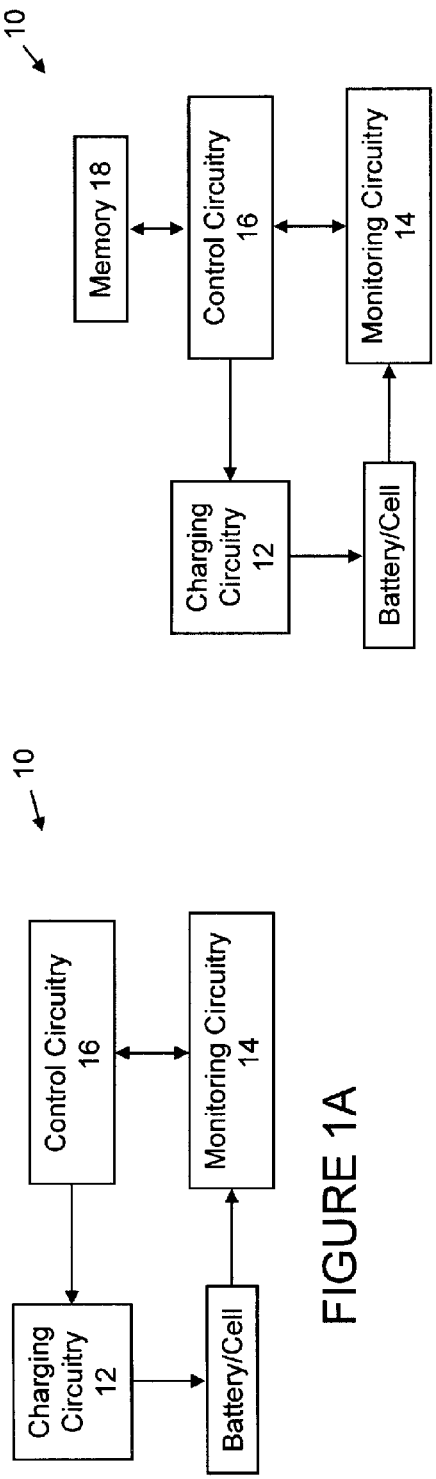

FIGURE 3A
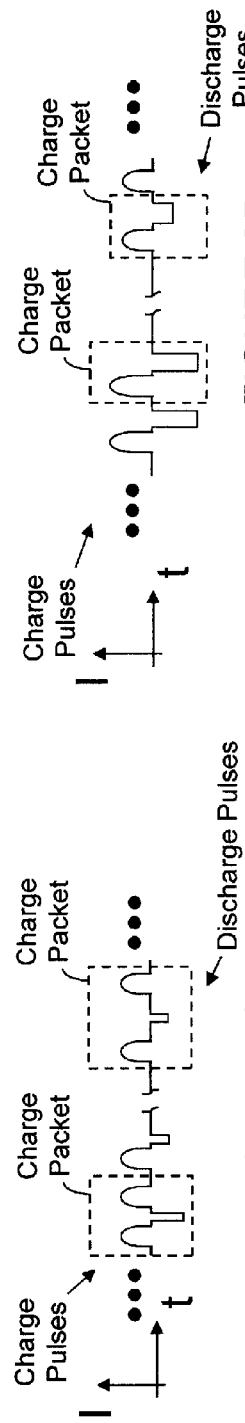
FIGURE 3C
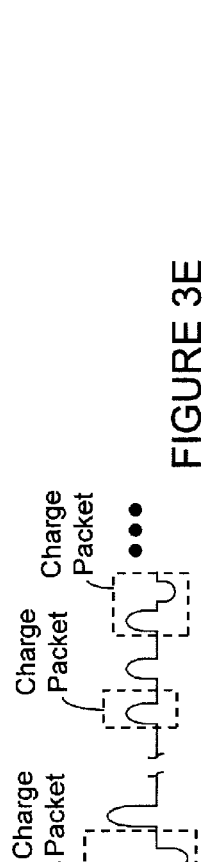
FIGURE 3B
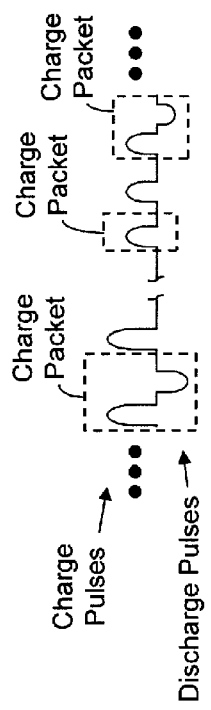
FIGURE 3D
FIGURE 3E

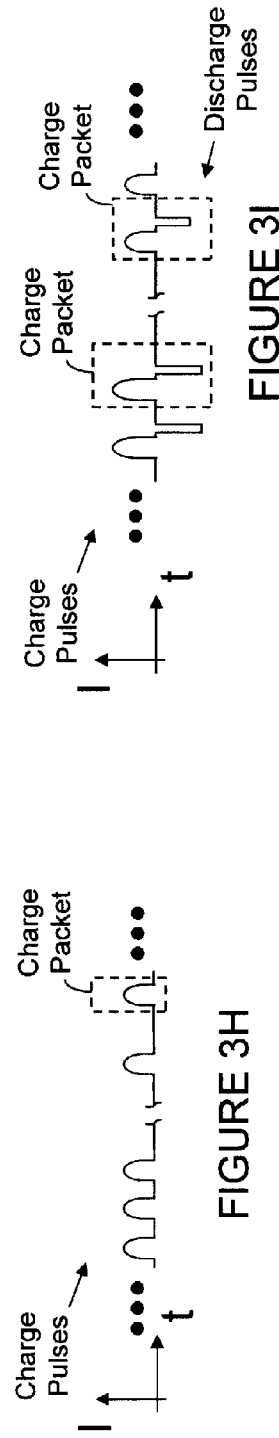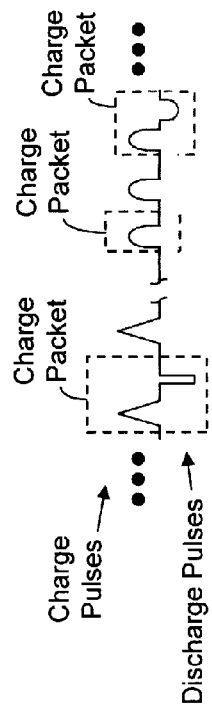
FIGURE 3F
FIGURE 3G
FIGURE 3H
FIGURE 3I
FIGURE 3J

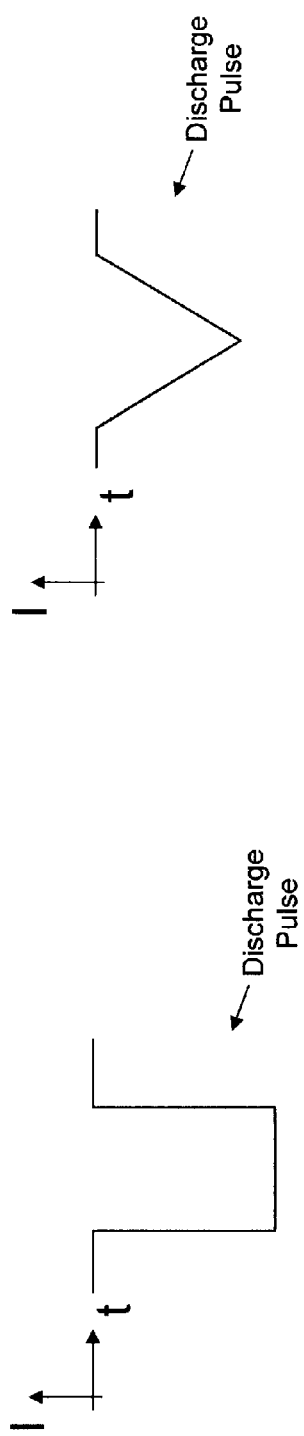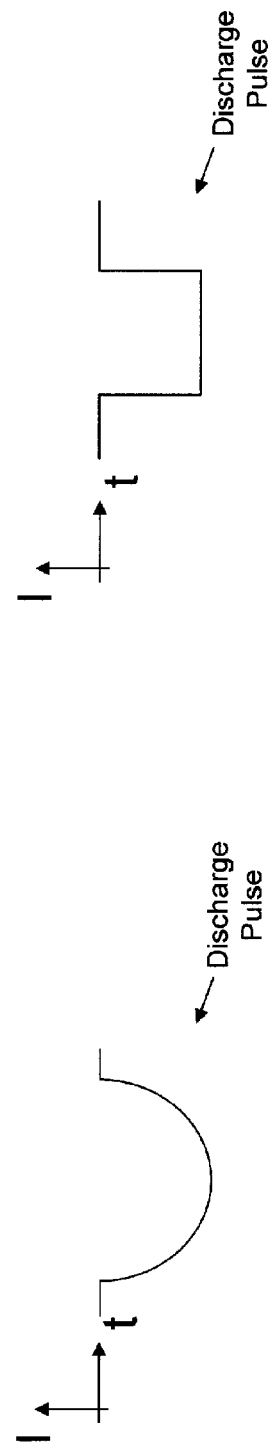
FIGURE 5A
FIGURE 5B
FIGURE 5C
FIGURE 5D

METHOD AND CIRCUITRY TO DETERMINE TEMPERATURE AND/OR STATE OF HEALTH OF A BATTERY/CELL

In one aspect, the present inventions relate to methods and circuitry to determine a temperature and/or a state of health (SOH) of a battery/cell. In particular, the present inventions are directed to techniques and/or circuitry to determine a temperature of a battery/cell using a partial relaxation time voltage ($V_{PRT}$) of a battery/cell in response to a calibration packet (which may include one or more charge pulses, discharge pulses and/or rest periods). The present inventions are also directed to techniques and/or circuitry to determine a state of health (SOH) of a battery/cell using a partial relaxation time voltage ($V_{PRT}$) of a battery/cell in response to a calibration packet (which may include one or more charge pulses, discharge pulses and/or rest periods). The partial relaxation time voltage ($V_{PRT}$) may be characterized as a relationship (for example, a difference) between (i) a terminal voltage of the battery/cell (i.e., a voltage measured at the terminals of the battery/cell) immediately prior to or at a beginning of a calibration packet (for example, immediately prior to or at a beginning of a charge or discharge pulse of the calibration packet) and (ii) (a) a terminal voltage, in response to a calibration packet, measured during the partial relaxation time period of a battery/cell, and/or (b) a peak voltage or substantial peak voltage (i.e., within 5-10% of the peak voltage of the battery/cell) measured during the partial relaxation time period of a response of the battery/cell to the calibration packet.

Notably, the SOH of a battery/cell (for example, a rechargeable lithium-ion) battery, is a parameter that describes, characterizes and/or is representative of the "age" of the battery/cell and/or ability of the battery/cell to hold or maintain charge, for example, relative to a given time in operation (for example, the initial time in operation—i.e., when the battery/cell is "new"). Moreover, the partial relaxation time period of the response of a battery/cell to a charge, discharge and/or calibration packet (any of which may include one or more charge pulses, discharge pulses and/or rest periods) is that period or portion of time (i) which coincides or substantially coincides with a rest period that temporally follows the last/final charge or discharge pulse of the calibration packet and/or (ii) after the end of the last/final charge or discharge pulse of the packet and before application of another charge or discharge pulse of, for example, an immediately subsequent charge, discharge and/or calibration packet.

In one embodiment, the circuitry and techniques determine and/or measure a partial relaxation time voltage ($V_{PRT}$) using a peak voltage detector circuit or technique to detect a peak or substantially peak voltage during the partial relaxation time period of the response of the battery/cell to a calibration packet. In this embodiment, the circuitry and techniques, in response to a calibration packet, measure the terminal voltage immediately prior to or at a beginning of the calibration packet (for example, immediately prior to or at a beginning of a charge or discharge pulse of the calibration packet). Thereafter, during the partial relaxation time period of the response of a battery/cell to the calibration packet, a peak voltage detector circuit or technique detects a peak or substantially peak voltage. The circuitry and techniques determine the partial relaxation time voltage ($V_{PRT}$) by subtracting (a) (i) the terminal voltage, in response to a calibration packet, measured during the partial relaxation time period of a battery/cell (for example, a relatively/temporary steady state voltage during the partial relaxation time period which, in one embodiment, may be determined and/or detected via evaluation of the slope of the response), or (ii) a peak voltage or substantial peak voltage (i.e., within 5-10% of the peak voltage of the battery/cell) measured during the partial relaxation time period of a response of the battery/cell to the calibration packet from (b) the terminal voltage of the battery/cell (i.e., a voltage measured at the terminals of the battery/cell) immediately prior to or at a beginning of a calibration packet (for example, immediately prior to or at a beginning of a charge or discharge pulse of the calibration packet)—or vice versa.

The circuitry and techniques, based on or using the partial relaxation time voltage ($V_{PRT}$), determine or estimate the temperature of the battery/cell by correlating (i) the partial relaxation time voltage ($V_{PRT}$) measured in response to a known or defined calibration packet at a given state of charge (SOC) and SOH of the battery/cell with (ii) a temperature of the battery. The circuitry and techniques may employ a database or a look-up table and/or mathematical relationship which correlate (i) an SOH of the battery/cell, (ii) a partial relaxation time voltage, and (iii) a temperature of the battery/cell. In another embodiment, where the circuitry and techniques have access to the measured temperature of the battery/cell (for example, a temperature sensor disposed on the battery/cell (for example, a thermistor) which provides data of the temperature of the battery/cell), the circuitry and techniques of this embodiment, in addition to determining the temperature using the partial relaxation time voltage ($V_{PRT}$), or in lieu thereof, may determine the SOH of the battery/cell using the database or a look-up table and/or mathematical relationship which correlates an SOH of the battery/cell, a partial relaxation time voltage, and temperature of the battery/cell.

Notably, in one embodiment, the circuitry and techniques of the present inventions may employ the determined or estimated temperature and/or SOH to adapt the charge or recharging sequence (for example, change, adjust, control and/or vary the charging current signal(s), including the characteristics thereof (including, for example, shape of charge and/or discharge signal (if any), amplitude thereof, duration thereof, duty cycle thereof and/or rest period (if any)), applied to the terminals of the battery/cell, operation or cycle. (See, for example, the techniques and circuitry described and illustrated in PCT Patent Application PCT/US2012/0030618 and U.S. patent application Ser. No. 13/366,352, both of which are incorporated by reference).

In one embodiment, the correlation data in the database or look-up table and/or mathematical relationship between an SOH of the battery/cell, a partial relaxation time voltage, and a temperature of the battery/cell is derived or obtained via a characterization sequence or a simulation which is (a) unique to a given or particular battery/cell and/or (ii) applicable to a lot of batteries/cells, particular chemistry of batteries/cells, and/or particular architecture of batteries/cells. For example, in one embodiment, such correlation or relationship for a particular battery/cell may be based on or using data acquired from the battery/cell during a characterization sequence wherein a predetermined charge sequence (including predetermined charge pulses) are applied to the battery/cell (for example, a "new" battery/cell). Thereafter, the techniques and/or circuitry evaluate the response of the battery/cell to such sequence and, based thereon, estimate, calculate or determine the correlation of or relationship between (a) an SOH of the battery/cell, (b) a partial relaxation time voltage measured in response to a known or defined calibration packet and for a given SOC of the battery/cell, and (c) a temperature of the particular battery/cell.

Such initialization or characterization data may be obtained, acquired and/or determined, for example, at manufacture, test or calibration which includes the initialization or characterization sequence to generate or obtain "unique" data or mathematical relationship regarding a given battery/cell. In one embodiment, the initialization or characterization sequence is implemented in conjunction with new batteries/cells over a full range of SOC of each of the batteries/cells. In one embodiment, the partial relaxation time voltage ($V_{PRT}$) in response to a known or defined calibration packet may be determined (via 10-100 measurements, and preferable, 20-50 measurements) over the full range of SOC of the battery/cell (for example, when such battery/cell is relatively "new" or the SOH is high, for example, the battery/cell has undergone less than five full or substantially full charge cycles).

In another embodiment, a charging sequence including charge packets and calibration packets (and, in certain embodiments, discharge packets) are used to cycle cells/batteries. During the charge sequence, the circuitry and techniques acquire calibration data via the calibration packets and, based thereon, correlation data or tables are generated to correlate (a) an SOH of the battery/cell, (b) a partial relaxation time voltage measured in response to a known or defined calibration packet and for a given SOC of the battery/cell, and (c) a temperature of the particular battery/cell with the capacity fade of the cells/batteries, and consequently with cycle life. Different values may be used on different batteries/cells (for example, different battery/cell chemistries, manufacturing processes, designs, architectures and/or manufacturers) to create more complete correlation relationships between partial relaxation time voltage ($V_{PRT}$) and capacity fade. Additionally, the partial relaxation time voltage ($V_{PRT}$) may be correlated using physical models to the transport of lithium-ions, such as, for example, solving Fick's law and current transport law/principles within the battery/cell.

Notably, data and/or a mathematical relationship which is representative of a correlation between (i) an SOH of the battery/cell, (ii) a partial relaxation time voltage measured in response to a known or defined calibration packet and (iii) a temperature of the battery/cell may be stored in memory for use by the circuitry and/or techniques of the present inventions. In one embodiment, the memory may be a discrete-type memory, for example, which is fixed or disposed on the battery/cell. In addition thereto, or in lieu thereof, in another embodiment, the memory is integrated in, on or with other circuitry (for example, a controller), for example, wherein the integrated circuit device, including the memory, is fixed or disposed on the battery/cell. The data which is representative of a correlation or relationship between (i) an SOH of the battery/cell, (ii) a partial relaxation time voltage measured in response to a known or defined calibration packet (and at a given or particular SOC of the battery) and (iii) a temperature of the battery/cell (which may include, for example, a mathematical relationship) may also be stored remotely—for example, in circuitry on a circuit board that is associated with the battery/cell but is not fixed thereto.

In another aspect, the present inventions are directed to an adaptive charging technique and circuitry for a battery/cell wherein one or more calibration packets (which are employed by control/measurement circuitry to detect, determine and/or measure, in situ, one or more characteristics and/or operating conditions of the battery/cell) are temporally integrated (for example, periodically—for example, at 1%, 5% or 10% increments of SOC during/over an entire charge sequence, or portion thereof) within an adaptive charging sequence which includes charge packets (and may also include discharge packets). The charge packets (and discharge packets, if any) may be modified or adapted in accordance with the response of the battery/cell to the calibration packets in the charging sequence. For example, based on a measured response of the battery/cell to one or more calibration packets within the charging sequence, the circuitry and techniques of the present inventions may change, modify, adjust, control and/or vary the charging current signal(s), including the characteristics thereof (including, for example, shape of charge and/or discharge signal (if any), amplitude thereof, duration thereof, duty cycle thereof and/or rest period (if any)), applied to the terminals of the battery/cell. (See, for example, PCT Patent Application PCT/US2012/0030618 and U.S. patent application Ser. No. 13/366,352). The calibration packets, however, are comprised of one or more charge pulses, discharge pulses and/or rest periods—in a predetermined, known and/or fixed temporal relationship wherein the characteristics of the one or more charge and discharge pulses (for example, amplitude and widths of the pulses), and/or rest periods (for example, temporal location and length) are predetermined and/or fixed. Here, the control circuitry does not adapt the characteristics of the charge pulses, discharge pulses and/or rest periods of the calibration packets based on one or more characteristics and/or operating conditions of the battery/cell.

In one embodiment, the temporal relationship and the characteristics of one or more charge pulses, discharge pulses and/or rest periods of calibration packets may be fixed over or in accordance with plurality of ranges of the SOC of the battery/cell. For example, in one embodiment, the calibration pulses may include (i) a first temporal relationship, first compilation of pulse(s) and rest period(s), and a first set of characteristics of such pulse(s) and rest period(s) when the SOC of the battery/cell SOC is 0-25%, (ii) a second temporal relationship, first compilation of pulse(s) and rest period(s), and a second set of characteristics of such pulse(s) and rest period (s) when the SOC of the battery/cell SOC is 25-75%, and (iii) a third temporal relationship, third compilation of pulse(s) and rest period(s), and a third set of characteristics of such pulse(s) and rest period(s) when the SOC of the battery/cell SOC is 75-100%. In addition thereto, or in lieu thereof, the temporal relationship and/or the characteristics of the one or more charge pulses, discharge pulses and/or rest periods of calibration packets may be a function of SOH and/or the ranges of the SOC of the battery/cell may be a function of SOH.

Notably, the SOC of a battery/cell, for example, a lithium-ion rechargeable battery/cell, is a parameter that is representative of and/or indicates the level of electrical charge available in the battery/cell. It may be characterized as a percentage of the nominal full charge rating of the battery/cell, wherein a 100% SOC indicates that a battery/cell is fully charged and a 0% indicates that the battery/cell is fully discharged. The SOC of the battery/cell may also be characterized as an available charge stored in the battery/cell relative to a maximum available charge stored in the battery/cell—wherein the maximum available charge may change over time as, for example, the battery/cell ages or deteriorates. As indicated herein, changes in the operating conditions may impact the battery/cell. For example, changes in temperature of the battery/cell may impact a maximum amount of charge the battery/cell is capable of storing and/or the maximum available charge from the battery/cell (hereinafter collectively, $Q_{max}$). For example, it is known that $Q_{max}$ decreases with lower temperature.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments.

Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Figure 1E:
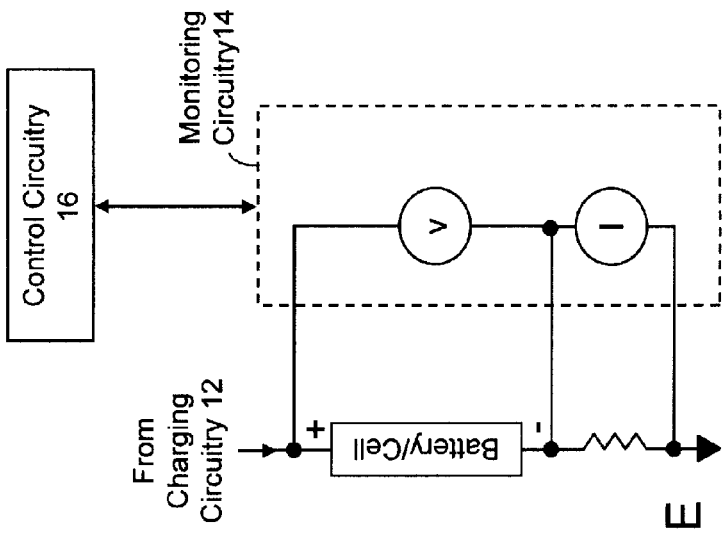
Figure 1D:
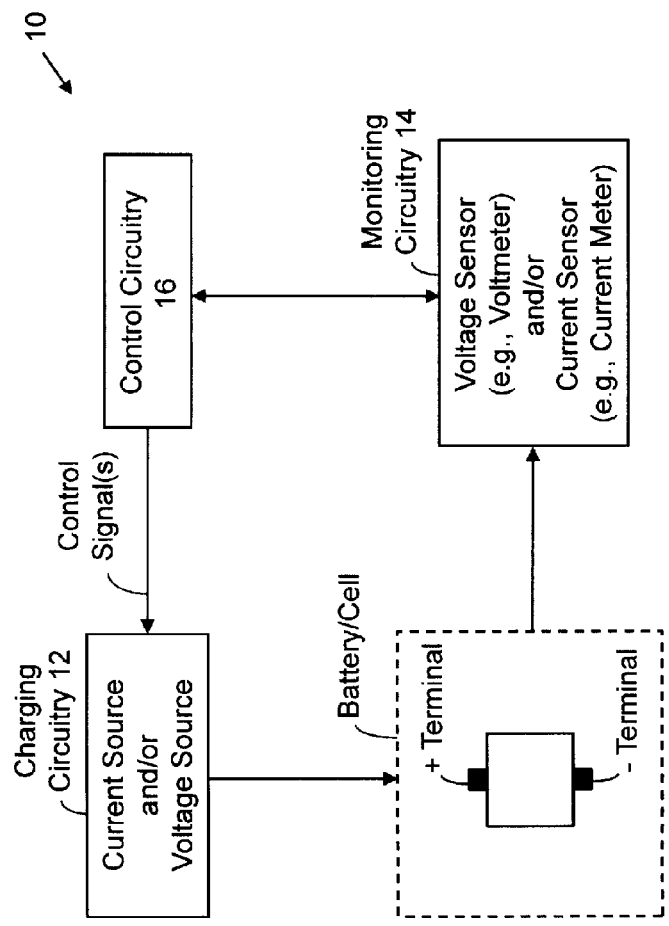
Figure 2A:
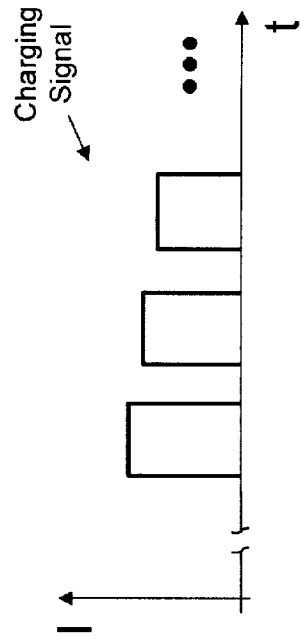
Figure 2B:
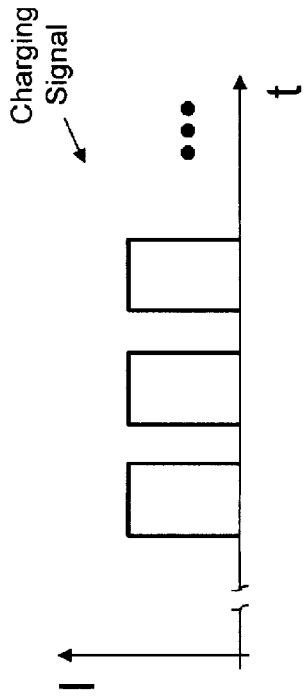
Figure 2C:
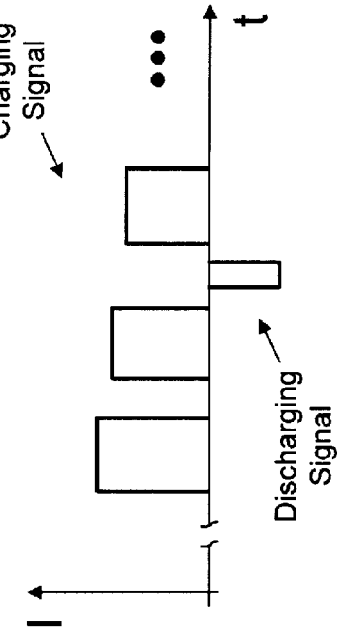
Figure 2D:
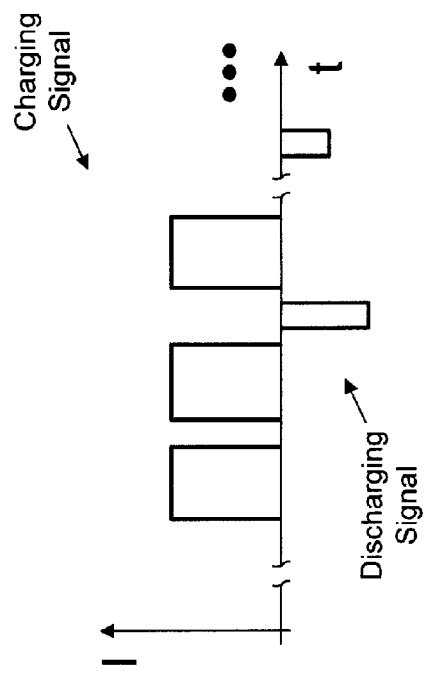
Figure 3K:
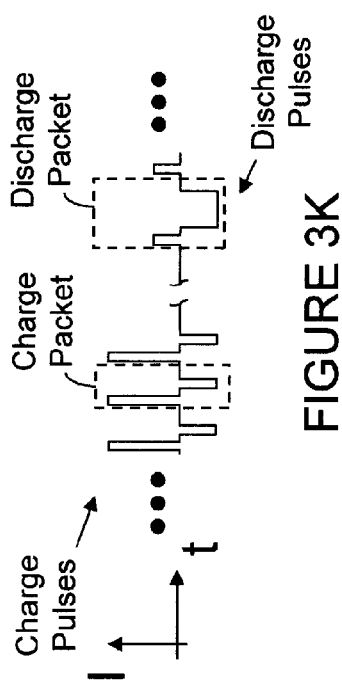
Figure 3M:
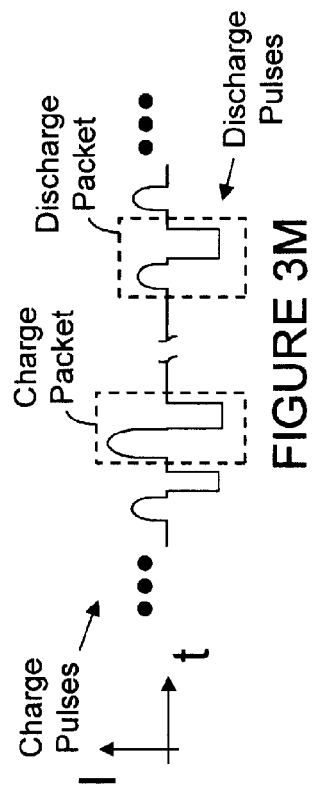
Figure 3L:
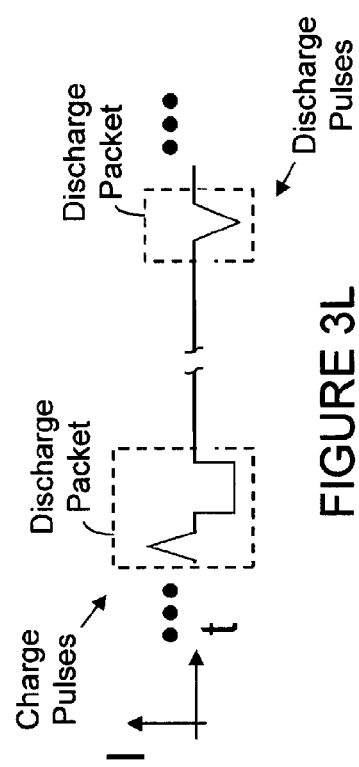
Figure 3N:
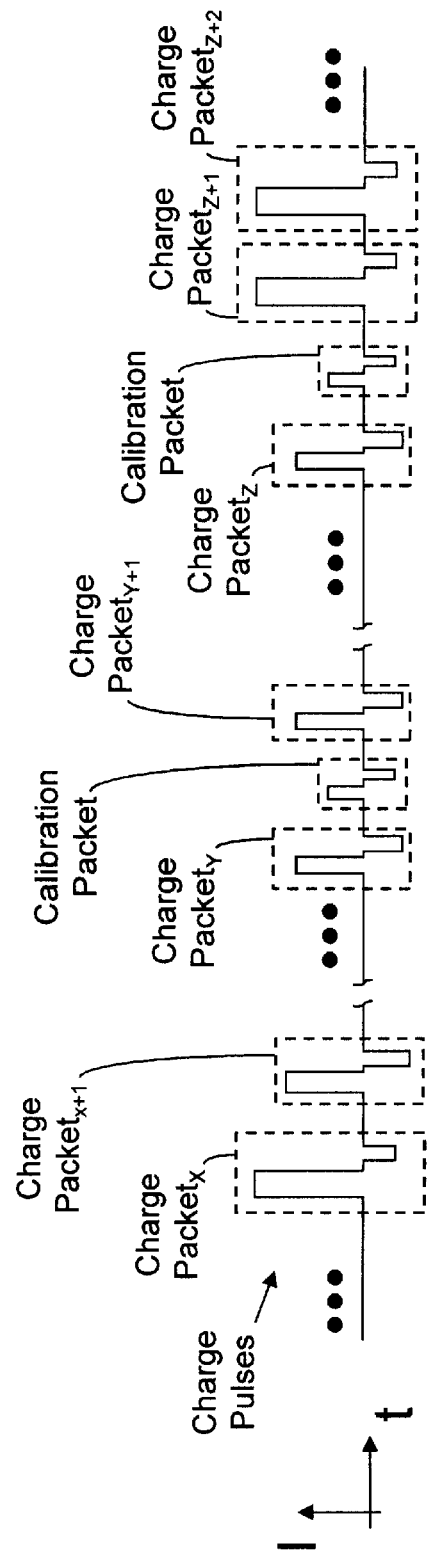
Figure 4A:
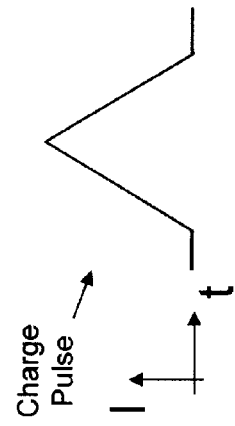
Figure 4B:
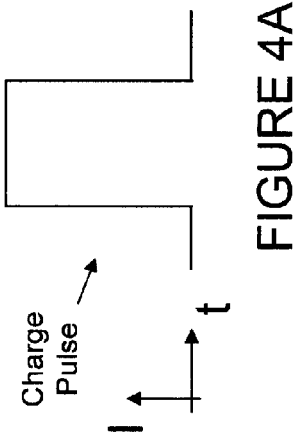
Figure 4C:
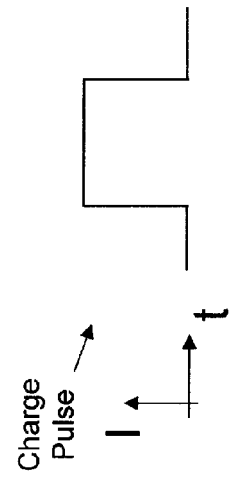
Figure 4D:
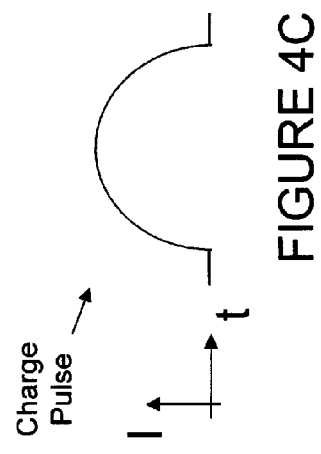
Figure 6:
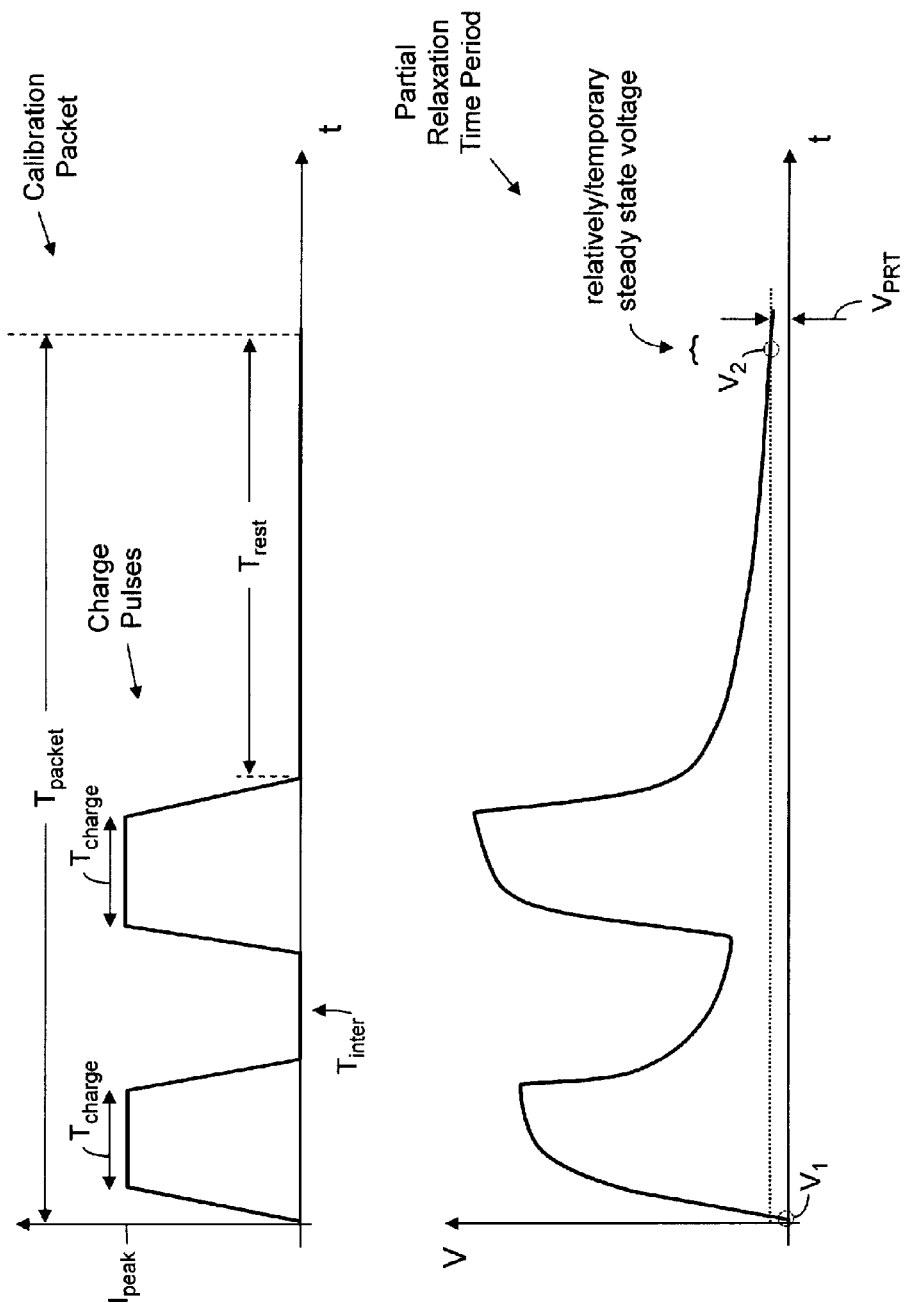
Figure 7A:
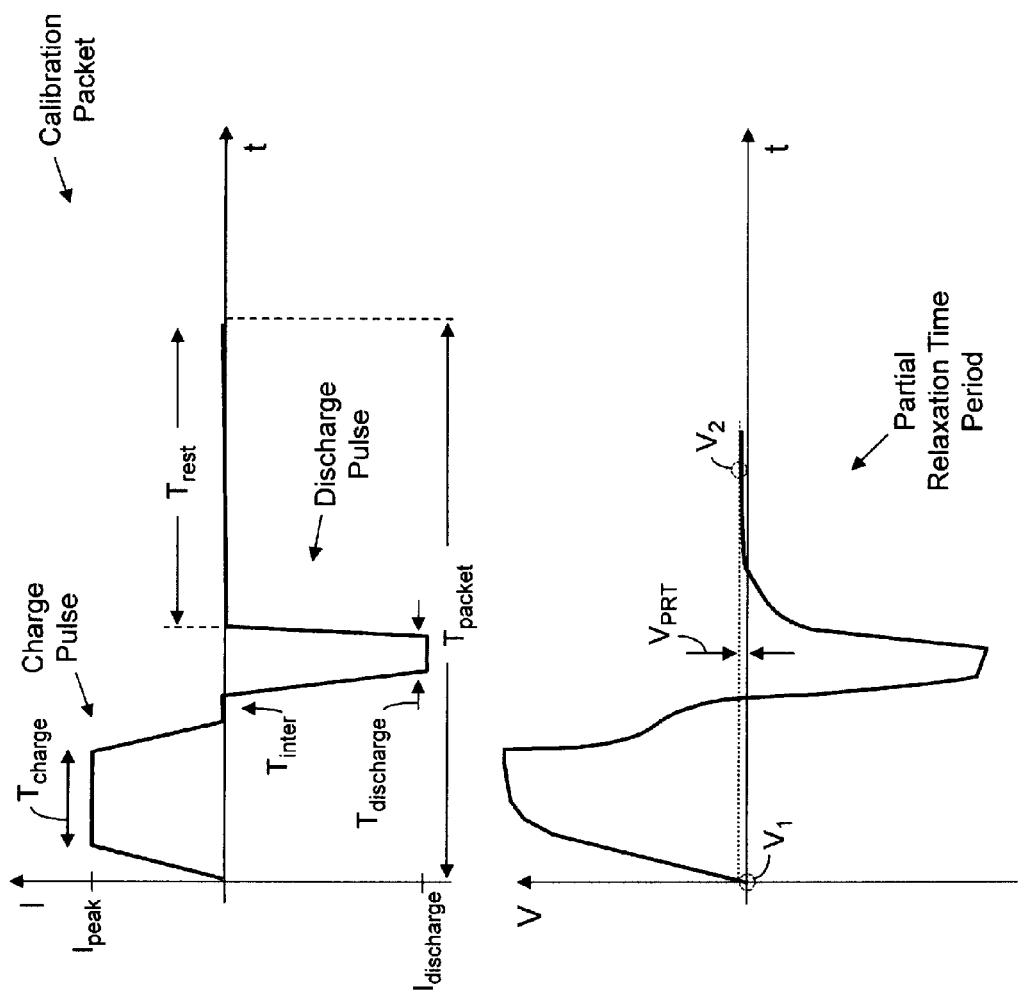
Figure 7B:
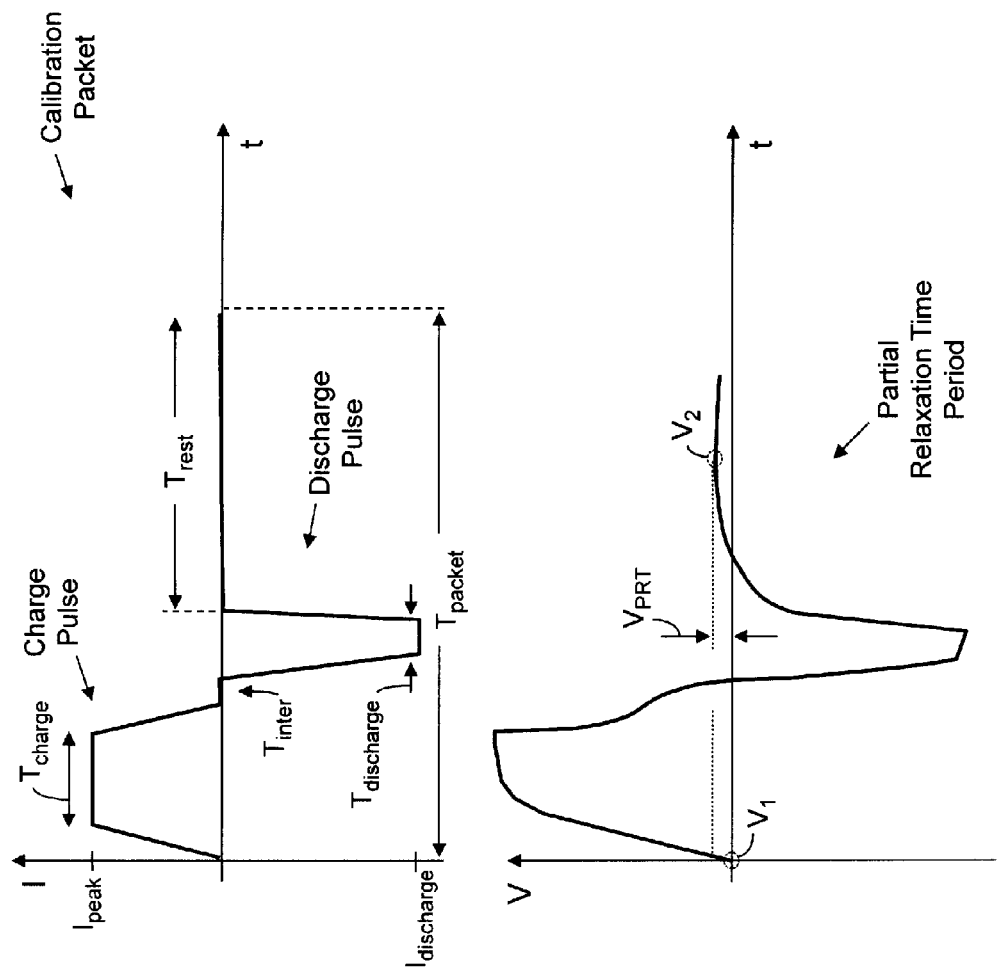
Figure 7C:
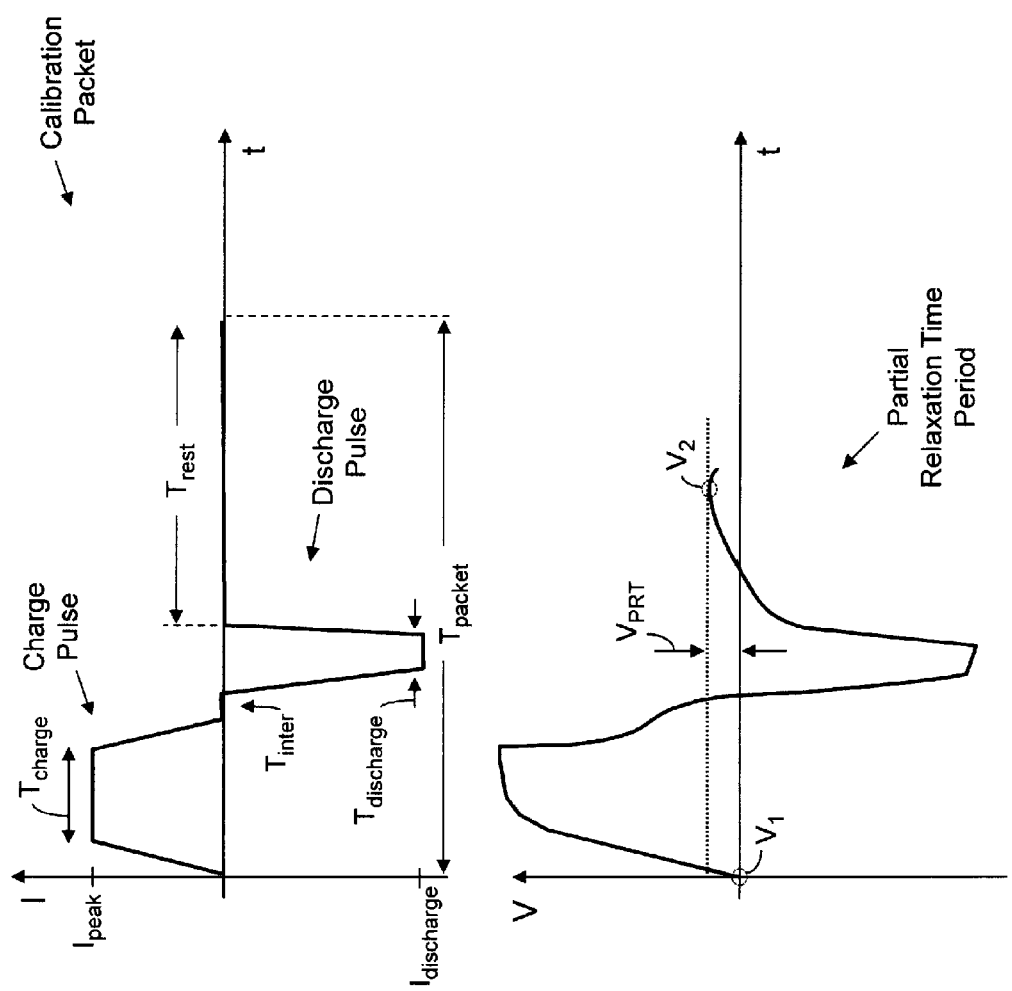
Figure 7D:
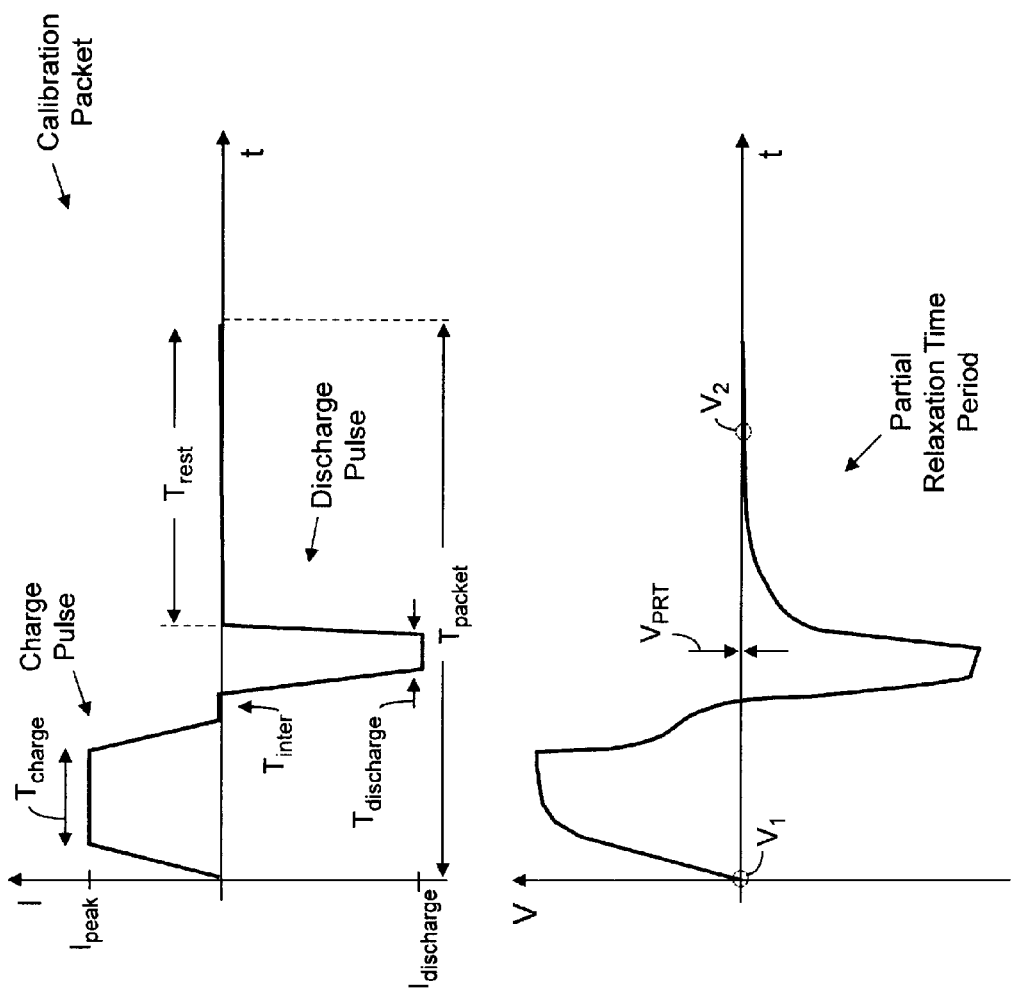
Figure 8B:
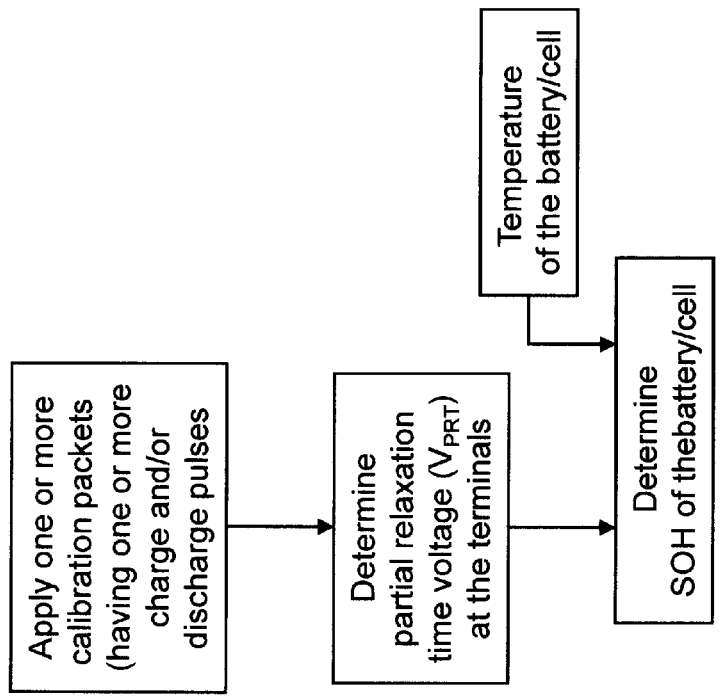
Figure 8A:
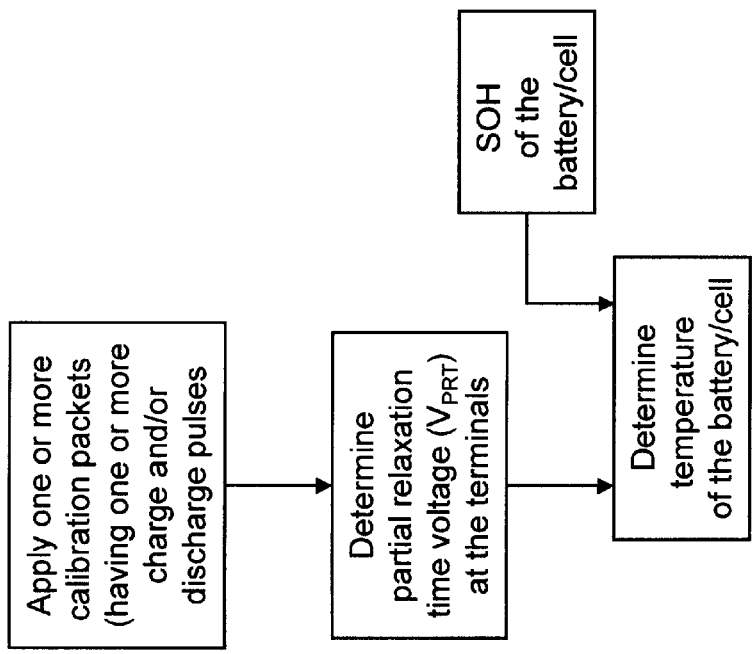
Figure 9:
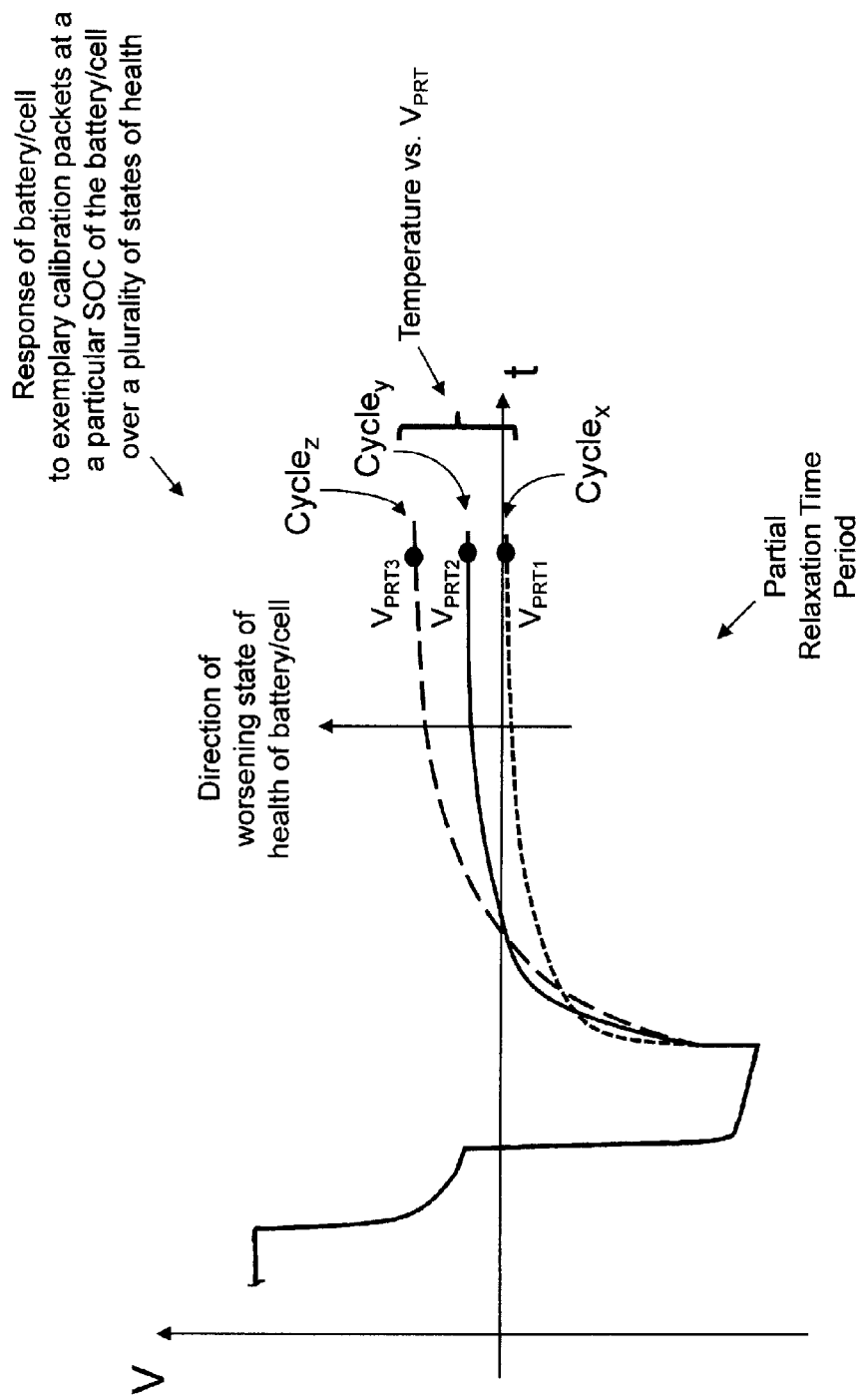

FIGS. 1A-1C illustrate block diagram representations of exemplary adaptive charging circuitry in conjunction with a battery/cell, according to at least certain aspects of certain embodiments of the present inventions, wherein FIG. 1B includes discrete memory coupled to the control circuitry, and FIG. 1C illustrates circuitry external which accesses the memory to store one or more predetermined ranges employed by control circuitry in conjunction with adapting, adjusting and/or controlling one or more characteristics of the charge or current applied to or injected into the battery/cell so that a change in voltage at the terminals of the battery/cell in response to such charge or current is within a predetermined range and/or below a predetermined value during a charging or recharging sequence, operation or cycle;

FIGS. 1D and 1E illustrate, in block diagram form, exemplary adaptive charging circuitry in conjunction with a battery/cell (which may include two terminals (for example, positive and negative terminals), according to at least certain aspects of certain embodiments of the present inventions, wherein in this embodiment, the charging circuitry may include voltage source and/or current source, and the monitoring circuitry may include voltage and/or current sensors (for example, a voltmeter and/or a current meter);

FIGS. 2A-2D illustrate exemplary waveforms illustrating a plurality of exemplary charging signals and discharging signals of an exemplary charging technique, wherein such charging signals may generally decrease according to a predetermined rate and/or pattern (for example, asymptotically, linearly or quadratically) as the terminal voltage of the battery/cell increases during a charging or recharging sequence, operation or cycle (see, FIGS. 2B and 2D); notably, a charging or recharging sequence, operation or cycle may include charging signals (which, in total, inject or apply charge into the battery/cell) and discharging signals (which, in total, remove charge from the battery/cell);

FIGS. 3A-3M illustrate exemplary charge and/or discharge packets of the charging and discharging signals (which are exemplary illustrated in FIGS. 2A-2D), wherein such charge and discharge packets may include one or more charge pulses and one or more discharge pulses; notably, in one embodiment, each charge signal of FIGS. 2A-2D may include a plurality of packets (for example, about 100 to about 50,000 packets) and, in one embodiment, each packet may include a plurality of charge pulses, discharge pulses and rest periods; notably, the pulses may be any shape (for example, rectangular, triangle, sinusoidal or square); in one exemplary embodiment, the charge and/or discharge pulses of the packet may include a temporal duration of between about 1 ms to about 2000 ms, and preferably less than 1000 ms; moreover, as discussed in detail below, one, some or all of the characteristics of the charge and discharge pulses (for example, pulse amplitude, pulse width/duration and pulse shape) are programmable and/or controllable via charging circuitry wherein the amplitude of the positive and/or negative pulses may vary within the packet (and are programmable and/or controllable), the duration and/or timing of the rest periods may vary within the packet (and are programmable and/or controllable) and/or, in addition, such pulses may be equally or unequally spaced within the packet; the combination of charging pulses, discharging pulses and rest periods may be repetitive and thereby forms a packet that may be repeated; all combinations or permutations of pulse, pulse characteristics, periods, packets and signal characteristics and configurations are intended to fall within the scope of the present inventions;

FIG. 3N illustrates exemplary calibration and charge packets of an exemplary charging signal (which are exemplary illustrated in FIGS. 2A-2D), wherein such calibration and charge packets may include one or more charge pulses and one or more discharge pulses and one or more rest periods; notably, in one embodiment, each charge signal of FIGS. 2A-2D may include a plurality of packets (for example, about 100 to about 50,000 packets) and, in one embodiment, the plurality of charge pulses, discharge pulses and/or rest periods of the packets may be changed, adjusted, controlled and/or varied in accordance with the response of the battery/cell to the charging sequence by changing, adjusting, controlling and/or varying the characteristics thereof (including, for example, shape of charge and/or discharge pulses (if any), amplitude thereof, duration thereof, duty cycle thereof and/or the temporal location and/or length of the rest period (if any)); the calibration packets, which are comprised of one or more charge pulses, discharge pulses and/or rest periods, however, are not adaptive and maintain a known and fixed temporal relationship throughout the charge cycle, sequence or process (or portions thereof—for example, over predetermined portions of SOC of the battery/cell); notably, the pulses of the calibration and charge packets may be any shape (for example, rectangular, triangle, sinusoidal or square); in one exemplary embodiment, the charge and/or discharge pulses of the packet may include a temporal duration of between about 1 ms to about 2000 ms, and preferably less than 1000 ms; moreover, the calibration packet sequence may be periodic (over a portion or the entire charging sequence) or periodic (over a portion or the entire charging sequence); all combinations or permutations of pulse, pulse characteristics, periods, packets and signal characteristics and configurations are intended to fall within the scope of the present inventions;

FIGS. 4A-4D illustrate exemplary charge pulses of calibration, charge and/or discharge packets, according to embodiments of the present inventions, wherein the charge pulses may have different shapes and pulse widths; all combinations or permutations of charge pulse characteristics are intended to fall within the scope of the present inventions; and FIGS. 5A-5D illustrate exemplary charge pulses of calibration, charge and/or discharge packets, according to embodiments of the present inventions, wherein the charge pulses may have different shapes and pulse widths; all combinations or permutations of discharge pulse characteristics are intended to fall within the scope of the present inventions;

FIG. 6 illustrates the response of a battery/cell to a plurality of charge pulses of an exemplary calibration packet wherein the partial relaxation time voltage ($V_{PRT}$) of the battery/cell, in response to the exemplary calibration packet, may be analyzed to determine and/or confirm the temperature and/or a state of health (SOH) of a battery/cell;

FIGS. 7A-7D illustrate the responses of a battery/cell to a an exemplary calibration packet wherein the partial relaxation time voltage ($V_{PRT}$) of the battery/cell, in response to the exemplary calibration packet, may be analyzed to determine and/or confirm the temperature and/or a state of health (SOH) of a battery/cell;

FIG. 8A is a flowchart of exemplary processes of determining the temperature of the battery/cell using the partial relaxation time voltage ($V_{PRT}$) (which is determined in response of the battery/cell to one or more calibration packets) and the SOH of the battery/cell, according to certain aspects of the present inventions;

FIG. 8B is a flowchart of exemplary processes of determining the SOH of the battery/cell using the partial relaxation time voltage ($V_{PRT}$) (which is determined in response of the battery/cell to one or more calibration packets) and a measured temperature of the battery/cell, according to certain aspects of the present inventions; and FIG. 9 illustrates an exemplary trend of the change in partial relaxation time voltage ($V_{PRT}$), at a given or particular SOC of the battery/cell as the state of health (SOH) of the battery/cell degrades wherein, as the battery/cell ages, deteriorates and/or degrades, the partial relaxation time voltage ($V_{PRT}$), for a given or particular SOC and temperature of the battery/cell, changes in relation to the SOH (or changes in the SOH) of the battery/cell, and similarly, as the temperature of the battery/cell changes, the partial relaxation time voltage ($V_{PRT}$), at a given SOC, changes in relation to a change in given temperature of the battery/cell, thus, the partial relaxation time voltage ($V_{PRT}$), which is measured in response to an exemplary calibration packet, changes in accordance with the state of health (SOH) and temperature of the battery/cell and, in this illustrative embodiment, the partial relaxation time voltage (for a given SOC) increases with temperature and worsening of the state of health from $SOH_x$ to $SOH_y$ to SOH, (which changes as the battery/cell ages, deteriorates and/or degrades).

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

Moreover, many other aspects, inventions and embodiments, which may be different from and/or similar to, the aspects, inventions and embodiments illustrated in the drawings, will be apparent from the description, illustrations and claims, which follow. In addition, although various features and attributes have been illustrated in the drawings and/or are apparent in light thereof, it should be understood that such features and attributes, and advantages thereof, are not required whether in one, some or all of the embodiments of the present inventions and, indeed, need not be present in any of the embodiments of the present inventions.

DETAILED DESCRIPTION

In a first aspect, the present inventions are directed to circuitry and techniques to determine a temperature and/or a state of health (SOH) of a battery/cell using a partial relaxation time voltage ($V_{PRT}$) of a battery/cell in response to a calibration packet (which may include (i) one or more charge and/or discharge pulses and (ii) one or more rest periods). As noted above, partial relaxation time voltage ($V_{PRT}$) may be characterized as a difference between (i) a terminal voltage of the battery/cell (i.e., a voltage measured at the terminals of the battery/cell) immediately prior to or at a beginning of a calibration packet (for example, immediately prior to or at a beginning of a charge or discharge pulse of the calibration packet) and (ii) (a) a terminal voltage, in response to a calibration packet, measured during the partial relaxation time period of a battery/cell, and/or (b) a peak voltage or substantial peak voltage (i.e., within 5-10% of the peak voltage of the battery/cell) measured during the partial relaxation time period of a response of the battery/cell to the calibration packet.

With reference to FIG. 1A, in one exemplary embodiment, circuitry 10 for a battery/cell includes charging circuitry 12, monitoring circuitry 14 and control circuitry 16 which implements one or more of the charging techniques described herein. Briefly, in one embodiment, charging circuitry 12, in response to control signals from the control circuitry 16, applies one or more current or charging signal to the battery/cell. (See, for example, FIGS. 2A and 2B). The charging circuitry 12 may also apply one or more charging signals (which provide a net input of charge or current into the battery/cell) and one or more discharging signals (which provide a net removal of charge or current from the battery/cell). (See, for example, FIGS. 2C and 2D). Notably, the present inventions may employ any programmable/controllable charging circuitry 12, whether described herein, now known or later developed, to apply charge packets and calibration packets to the battery/cell; all such charging circuitry 12 are intended to fall within the scope of the present inventions. For example, charging circuitry 12 of the present inventions may generate charging and discharging signals, packets and pulses (as described herein). Notably, charging circuitry 12 is generally responsive to control signals from control circuitry 16.

Briefly, with reference to FIGS. 3A-3J, the charging and discharging signals may include a plurality of charge packets wherein each charge packet includes one or more charge pulses and, in certain embodiments, one or more discharge pulses. The charging and discharging signals may also include one or more discharge packets wherein each discharge charge packet includes one or more discharge pulses (and, in certain embodiments, one or more charge pulses). (See, FIGS. 3K-3N). Indeed, the charging and discharging signals may also include charge packets and one or more discharge packets wherein each charge packet and discharge packet includes one or more charge pulses and/or one or more discharge pulses. (See, FIGS. 3K and 3N).

With reference to FIG. 3N, in one embodiment, the charging circuitry applies a charging sequence including calibration and charge packets (and, in certain embodiments, one or more discharge packets) wherein such calibration and charge packets may include one or more charge pulses, discharge pulses and rest periods. In one embodiment, the charge/discharge packets are adaptive wherein the charge pulses, discharge pulses and/or rest periods of the packets may be changed, adjusted, controlled and/or varied in accordance with the response of the battery/cell to the charging sequence by changing, adjusting, controlling and/or varying the characteristics thereof (including, for example, shape of charge and/or discharge pulses (if any), amplitude thereof, duration thereof, duty cycle thereof and/or the temporal location and/or length of the rest period (if any)).

The calibration packets, which are comprised of (i) one or more charge pulses and/or discharge pulses and (ii) one or more rest periods, are not adaptive and, in one embodiment, maintain a known and fixed temporal relationship throughout the charge cycle, sequence or process (or portions thereof—for example, over predetermined portions of SOC of the battery/cell). Notably, the pulses of the calibration and charge packets may be any shape (for example, rectangular, triangle, sinusoidal or square (See FIGS. 4A-4D and 5A-5D). The pulses of the calibration and charge packets may be the same shape and/or width or different shape and/or width. In one exemplary embodiment, the application of calibration packets to the battery/cell, relative to the charge packet, is periodic and/or in a predetermined sequence relative to the charge and/or discharge packets. In another embodiment, the sequence of the calibration and charge packet sequences is partially or fully aperiodic wherein the application of the calibration packets to the battery/cell (via the charging circuitry) is determined and controlled by the control circuitry (for example, based on the operating conditions or characteristics of the battery/cell). Indeed, all combinations or permutations of pulse, pulse characteristics, periods, packets and signal characteristics and configurations of the pulses of the calibration and charge packets are intended to fall within the scope of the present inventions.

With reference to FIGS. 1A, 6 and 7A-7D, in one embodiment, monitoring circuitry 14 measures, samples and/or determines (for example, on an intermittent, continuous and/or periodic basis) the terminal voltage of the battery/cell in response to a calibration packet. In particular, monitoring circuitry 14 measures, samples and/or determines the terminal voltage (i) immediately prior to or at a beginning of a calibration packet, for example, immediately prior to or at a beginning of a charge or discharge pulse of a calibration packet (see, for example, $V_1$) and (ii) during the partial relaxation time period (for example, during the entire partial relaxation time period or only a portion thereof (see, for example, $V_2$). For example, in one embodiment, monitoring circuitry 14 measures, samples and/or determines the terminal voltage of the battery/cell to determine or detect a relatively/temporary steady state voltage (for example, approximately 10-20 microvolts per second during the partial relaxation time period (see, FIG. 6) which may be determined and/or detected, for example, via evaluation of the slope of the response) or a peak voltage in response to a calibration packet during the partial relaxation time period (see, FIGS. 7A-7D). The monitoring circuitry 14 provides the voltage data which is representative of the condition or characteristics of the battery/cell (for example, voltages $V_1$ and $V_2$) to control circuitry 16.

Notably, the circuitry and techniques of the present inventions may employ any monitoring circuitry 14 and/or measuring or monitoring techniques, whether described herein, now known or later developed, to acquire such data; all such monitoring circuitry 14 and measuring or monitoring techniques are intended to fall within the scope of the present inventions. The monitoring circuitry monitors, senses, detects and/or samples (on an intermittent, continuous and/or periodic basis) characteristics of the battery/cell including, for example, the response of the battery/cell to one or more charge pulses, the terminal voltages and the temperature (via one or more temperature sensors (not illustrated) which is/are thermally coupled to the battery/cell to generate, measure and/or provide data which is representative of the temperature of the battery/cell). In one embodiment, the monitoring circuitry includes a sensor to determine a voltage (for example, a voltmeter) and/or a sensor to determine a current (for example, a current meter). (See, for example, FIGS. 1D and 1E). In one embodiment, the monitoring circuitry implements Kelvin-type measurement configurations in that little to no current is required to determine the voltage at the terminals of the battery/cell and the current through the battery/cell. Notably, the monitoring circuitry and techniques may be those described herein, now known or later developed, to acquire data employed by the control circuitry to adaptive the charging profile of the battery; all such monitoring circuitry and techniques are intended to fall within the scope of the present inventions.

With reference to FIGS. 1A-1E, control circuitry 16 and techniques implemented thereby, employ terminal voltages measured by the monitoring circuitry to determine a temperature and/or a state of health (SOH) of the battery/cell using a partial relaxation time voltage ($V_{PRT}$) of the battery/cell in response to a calibration packet. For example, in one embodiment, control circuitry 16 employs the terminal voltage immediately prior to or at a beginning of a charge or discharge pulse of a calibration packet ($V_1$) and during the partial relaxation time period ($V_2$). (See, for example, FIGS. 7A-7D). In one embodiment, to detect a peak voltage during the partial relaxation time period, a peak voltage detector circuit or technique is employed to determine the terminal voltage ($V_2$) of the battery/cell (in response to the calibration packet) during the partial relaxation time period.

As noted above, the partial relaxation time voltage ($V_{PRT}$) may be characterized as a difference between (i) a terminal voltage of the battery/cell (i.e., a voltage measured at the terminals of the battery/cell) immediately prior to or at a beginning of a calibration packet (for example, immediately prior to or at a beginning of a charge or discharge pulse of the calibration packet) and (ii) (a) a terminal voltage, in response to a calibration packet, measured during the partial relaxation time period of a battery/cell, and/or (b) a peak voltage or substantial peak voltage measured during the partial relaxation time period of a response of the battery/cell to the calibration packet. (See, for example, FIGS. 6 and 7A-7D). Moreover, the partial relaxation time period of the response of a battery/cell to a charge, discharge and/or calibration packet (any of which may include one or more charge pulses, discharge pulses and/or rest periods) is that period or portion of time (i) which coincides or substantially coincides with a rest period that temporally follows the last/final charge or discharge pulse of the calibration packet and/or (ii) after the end of the last/final charge or discharge pulse of the packet and before application of another charge or discharge pulse of, for example, an immediately subsequent charge, discharge and/or calibration packet. (See, for example, FIGS. 6 and 7A-7D).

In one embodiment, control circuitry 16 estimates, calculates and/or determines the temperature of the battery/cell by correlating the partial relaxation time voltage ($V_{PRT}$) measured in response to a known or defined calibration packet with the SOH of the battery. In this embodiment, control circuitry 16, based on the partial relaxation time voltage ($V_{PRT}$) measured at a particular SOC and in response to a calibration packet and the SOH of the battery/cell estimates, calculates and/or determines the temperature of the battery/cell using a correlation database or look-up table. In another embodiment, control circuitry 16 may employ a mathematical relationship which characterizes the relationship between the partial relaxation time voltage, SOH and temperature to determine the temperature of the battery/cell by correlating the partial relaxation time voltage measured in response to a known or defined calibration packet with the SOH of the battery.

Notably, in response to the determination of the temperature, control circuitry 16 may calculate, determine and/or implement a change in the charging sequence or profile. That is, control circuitry 16 (and techniques implemented thereby) may employ the temperature to adapt the charge or recharging sequence (for example, change, adjust, control and/or vary the charging current signal(s), including the characteristics thereof (including, for example, shape of charge and/or discharge signal (if any), amplitude thereof, duration thereof, duty cycle thereof and/or rest period (if any)), applied to the terminals of the battery/cell, operation or cycle. (See, for example, PCT Application Serial No. PCT/US2012/30618 and U.S. patent application Ser. No. 13/366,352).

The correlation data in the database or look-up table may be compiled, derived or obtained via a characterization sequence or a simulation which is (a) unique to a given or particular battery/cell and/or (ii) applicable to a lot of batteries/cells, particular chemistry of batteries/cells, and/or particular architecture of batteries/cells. For example, in one embodiment, such correlation or relationship for a particular battery/cell may be based on or using data acquired from the battery/cell during a characterization sequence wherein a predetermined charge sequence (including predetermined charge pulses) are applied to the battery/cell (for example, a "new" battery/cell). Here, the charge sequence may include a plurality of calibration packets integrated into the predetermined charge sequence. Thereafter, the techniques and/or circuitry evaluate the response of the battery/cell to such sequence (for example, the response to the calibration packets) and, based thereon, estimate, calculate or determine the correlation of or relationship between (a) an SOH of the battery/cell, (b) a partial relaxation time voltage measured in response to a known or defined calibration packet and for a given SOC of the battery/cell, and (c) a temperature of the particular battery/cell.

Such initialization or characterization data may be obtained, acquired and/or determined, for example, at manufacture, test or calibration which includes the initialization or characterization sequence to generate or obtain "unique" data or mathematical relationship regarding a given battery/cell. In one embodiment, the initialization or characterization sequence is implemented in conjunction with new batteries/cells over a full range of SOC of each of the batteries/cells. In one embodiment, the partial relaxation time voltage ($V_{PRT}$) in response to a known or defined calibration packet may be determined (via 10-100 measurements, and preferable, 20-50 measurements) over the full range of SOC of the battery/cell (for example, when such battery/cell is relatively "new" or the SOH is high, for example, the battery/cell has undergone less than five full or substantially full charge cycles).

Thus, in this embodiment, the circuitry and techniques acquire calibration data via the calibration packets and, based thereon, correlation data or tables are generated to correlate (a) an SOH of the battery/cell, (b) a partial relaxation time voltage measured in response to a known or defined calibration packet and at a given or known SOC of the battery/cell, and (c) a temperature of the particular battery/cell with the capacity fade of the cells/batteries, and consequently with cycle life. Different values may be used on different batteries/cells (for example, different battery/cell chemistries, manufacturing processes, designs, architectures and/or manufacturers) to create more complete correlation relationships between partial relaxation time voltage ($V_{PRT}$) and capacity fade. Additionally, the partial relaxation time voltage ($V_{PRT}$) may be correlated using physical models to the transport of lithium-ions, such as, for example, solving Fick's law and current transport law/principles within the battery/cell.

The database or look-up table may be unique for a given battery/cell or may be based on and/or employ data acquired via a battery/cell which is representative of a common series, manufacturing lot, chemistry and/or design of the battery/cell. In this regard, in one embodiment, based on empirical data, test data, simulation data, theoretical data and/or a mathematical relationship in conjunction with data which is representative of a series, manufacturing lot, chemistry and/or design of the battery/cell, a correlation or relationship may be determined or calculated for a given battery/cell, lot of batteries/cells and/or chemistry of batteries/cells. Indeed, in one embodiment, the correlation or relationship between (i) an SOH of the battery/cell, (ii) a partial relaxation time voltage measured in response to a known or defined calibration packet and (iii) a temperature of the battery/cell may be determined or calculated for a given battery/cell, lot and/or chemistry based on or using a characterization sequence which may be associated with the given battery/cell, lot of batteries/cells and/or chemistry of batteries/cells (for example, due to a common or similar certain series, manufacturing lot, chemistry and/or design).

In another embodiment, the database or look-up table may be compiled, generated and/or calculated using simulation data, theoretical data and/or a mathematical relationship. For example, based on simulation data, theoretical data and/or a mathematical relationship, circuitry (which may be internal or external to the control circuitry) compiles, generates and/or calculates a correlation or relationship between (a) an SOH of the battery/cell, (b) a partial relaxation time voltage measured in response to a known or defined calibration packet and for a given SOC of the battery/cell and (c) a temperature of the battery/cell. Again, such correlation or relationship may be applicable to a given battery/cell, lot and/or battery/cell chemistry, design or architecture due to a common certain series, manufacturing lot, chemistry, manufacturer and/or design. Notably, the data which is representative of a correlation or relationship may be compiled, generated and/or calculated remotely—for example, in circuitry of a characterization system.

The data or mathematical relationship which is representative of a correlation between (i) an SOH of the battery/cell, (ii) a partial relaxation time voltage measured in response to a known or defined calibration packet and (iii) a temperature of the battery/cell may be stored in memory for use by the circuitry and/or techniques of the present inventions. For example, with reference to FIGS. 1A-1E, the memory may be integrated in, on or with control circuitry 16 (see, for example, FIGS. 1A, 1D and 1E) and/or discrete, for example, which is fixed or disposed on the battery/cell (see, for example, FIGS. 1B and 1C). Notably, in addition thereto, or in lieu thereof, the data and/or mathematical relationship which are/is representative of such correlation may be stored remotely—for example, in circuitry on a circuit board that is associated with the battery/cell but is not fixed thereto.

With that in mind, data or mathematical relationship which is representative of a correlation between (i) an SOH of the battery/cell, (ii) a partial relaxation time voltage measured in response to a known or defined calibration packet and (iii) a temperature of the battery/cell may be stored in permanent, semi-permanent or temporary memory. In this regard, the memory may store data, equations, relationships, database and/or look-up table in a permanent, semi-permanent or temporary (for example, until re-programmed) memory of any kind or type (for example, EEPROM, Flash, DRAM and/or SRAM). Moreover, as noted above, the memory may be discrete or resident on (i.e., integrated in) other circuitry of the present inventions (for example, control circuitry). In one embodiment, the memory may be one-time programmable, and/or the data, equations, relationships, database and/or look-up table of the predetermined range(s) may be stored in a one-time programmable memory (for example, programmed during test or at manufacture). In another embodiment, the memory is more than one-time programmable and, as such, the predetermined range(s) may be updated, written, re-written and/or modified after initial storage (for example, after test and/or manufacture) via external or internal circuitry.

Notably, control circuitry 16 may include one or more processors, one or more state machines, one or more gate arrays, programmable gate arrays and/or field programmable gate arrays, and/or a combination thereof. Indeed, control circuitry and monitoring circuitry may share circuitry with each other as well as with other elements; such circuitry may be distributed among a plurality of integrated circuits which may also perform one or more other operations, which may be separate and distinct from that described herein. Moreover, control circuitry 16 may perform or execute one or more applications, routines, programs and/or data structures that implement particular methods, techniques, tasks or operations described and illustrated herein. The functionality of the applications, routines or programs may be combined or distributed. In addition, the applications, routines or programs may be implemented by control circuitry 16 using any programming language whether now known or later developed, including, for example, assembly, FORTRAN, C, C++, and BASIC, whether compiled or uncompiled code; all of which are intended to fall within the scope of the present inventions.

With reference to FIGS. 1A-1E, 7A-7D and 8A, in one embodiment, control circuitry 16, and techniques implemented thereby, determine and/or measure a partial relaxation time voltage ($V_{PRT}$) using a peak voltage detector circuit or technique to detect a peak or substantially peak voltage during the partial relaxation time period of the response of the battery/cell to a calibration packet. In this embodiment, measurement circuitry 14, measures the terminal voltage of the battery/cell immediately prior to or at a beginning of the calibration packet (for example, immediately prior to or at a beginning of a charge or discharge pulse of the calibration packet—see $V_1$). Then, during the partial relaxation time period of the response of a battery/cell to the calibration packet, a peak voltage detector circuit or technique (which may be disposed in measurement circuitry 14 and/or control circuitry 16) detects a peak or substantially peak voltage (see $V_2$). The control circuitry determines the partial relaxation time voltage ($V_{PRT}$) and, based thereon, determines or estimates the temperature of the battery/cell by correlating the partial relaxation time voltage ($V_{PRT}$) measured in response to a known or defined calibration packet (at a particular SOC of the battery) with the SOH of the battery/cell in a database or a look-up table and/or mathematical relationship which correlates (i) an SOH of the battery/cell, (ii) a partial relaxation time voltage, and (iii) a temperature of the battery/cell.

With additional reference to FIG. 8B, in another embodiment, where the circuitry and techniques have access to the measured temperature of the battery/cell (for example, a temperature sensor disposed on the battery/cell (for example, a thermistor) which provides data of the temperature of the battery/cell), control circuitry 16, and techniques implemented thereby, may determine the SOH of the battery/cell using the database or a look-up table and/or mathematical relationship which correlates an SOH of the battery/cell with a partial relaxation time voltage (for states of charge of the Battery/cell) with a temperature of the battery/cell.

Notably, as mentioned above, the SOH of a rechargeable battery/cell (for example, a rechargeable lithium-ion battery/cell, is a parameter that describes, characterizes and/or is representative of the "age" of the battery/cell, the degradation levels of the battery/cell and/or an ability of the battery/cell to hold charge, for example, relative to a given time in operation (for example, the initial time in operation). As such, the partial relaxation time voltage ($V_{PRT}$) of the battery/cell for a given SOC changes as the SOH changes—and, hence the voltage curves of the battery/cell tend to shift as the battery/cell ages and as the SOH of the battery/cell SOH (and its ability to retain, maintain and/or store charge) deteriorates. (See, for example, FIG. 9).

With reference to FIGS. 1A-1E, 3N, 6 and 7A-7D, in another aspect, the present inventions are directed to implementing one or more calibration packets in an adaptive charging sequence to charge or recharge a battery/cell. The one or more calibration packets may be employed by measurement circuitry 14 and control circuitry 16 to detect, determine and/or measure certain characteristics and operating conditions of the battery/cell (in situ). In one embodiment, control circuitry 16 temporally incorporates the calibration packets within the adaptive charging sequence (via control signals applied to charging circuitry 12) at a plurality of predetermined states of charge of the battery/cell (for example, 1%, 5% or 10% increments of SOC during a charge sequence). Here, charging circuitry 12, in response to control signals from control circuitry 16, generates and applies charging signals (which may include, for example, charge packets and discharge packets (if any)) to the battery/cell. The control circuitry 16 may generated such control signals in a periodic fashion (for example, at 5% or 10% increments of SOC of the battery/cell) or in an aperiodic fashion (for example, in response to detecting a change in operating characteristics of the battery/cell (for example, temperature).

As noted above, the charging signal also includes adaptive charge packets (and discharge packets, if any) which charging circuitry 12 may, in one embodiment, generate in response to control signals from control circuitry 16. The charge packets (and discharge packets, if any) may be adapted in accordance with the response of the battery/cell to the calibration packets in the charging sequence. For example, based on a measured response of the battery/cell to one or more calibration packets within the charging sequence, control circuitry 16 (and techniques implemented thereby) may change, adjust, control and/or vary the charging current signal(s), including the characteristics thereof (including, for example, shape of charge and/or discharge signal (if any), amplitude thereof, duration thereof, duty cycle thereof and/or rest period (if any)), applied to the terminals of the battery/cell. (See, for example, PCT Patent Application PCT/US2012/0030618 and U.S. patent application Ser. No. 13/366,352). The control circuitry, however, does not adapt the characteristics of the charge pulses, discharge pulses and/or rest periods of the calibration packets based on one or more characteristics and/or operating conditions of the battery/cell In one exemplary embodiment, the application of calibration packets to the battery/cell, relative to the charge packet, is periodic and/or in a predetermined sequence and/or ratio relative to the charge and/or discharge packets. For example, in one embodiment, one or more calibration packets are temporally integrated into the adaptive charge sequence or cycle at 1%, 5% or 10% increments of SOC of the battery/cell during or over a charge sequence. Such 1%, 5% or 10% increments of SOC of the battery/cell may change based or in accordance with SOC and/or SOH. For example, at 5% or 10% increments of SOC between 0-25% SOC, at 5% increments of SOC between 25-75% SOC, and 1% or 5% increments of SOC between 75-100% SOC.

In another exemplary embodiment, the calibration packets are temporally integrated into the adaptive charge sequence or cycle based on a fixed or adjustable ratio relative to the charge and/or discharge packets—for example, calibration packet to charge packets ratio may be 1:10, 1:50 or 1:100. That ratio may change in accordance with SOC and/or SOH. For example, the ratio of calibration packets to charge packets may change in accordance with the SOC of the battery/cell (for example, 1:50 at 0-25% SOC, 1:100 at 25-75% SOC and 1:25 at 75-100% SOC). Moreover the ratio of calibration packets to charge packets may change in accordance with the SOC and SOH of the battery/cell (for example, at a first SOH, the ratios may be 1:25 at 0-25% SOC, 1:50 at 25-75% SOC and 1:15 at 75-100% SOC, and at a second SOH (which is lower than the first SOH—i.e., the battery/cell is less robust), the ratios may be 1:50 at 0-25% SOC, 1:200 at 25-75% SOC and 1:50 at 75-100% SOC). The control circuitry 16 may control/program charging circuitry 12 to generate the calibration packets at the appropriate time (for example, at 1%, 5% or 10% increments of SOC of the battery/cell during or over a charge sequence) and/or provide the predetermined and/or desired ratios of calibration packet to charge packets.

In another embodiment, the ratio and/or sequence of the calibration and charge packet sequence is partially or fully aperiodic wherein the application of the calibration packets to the battery/cell (via the charging circuitry) is determined and controlled by the control circuitry (for example, based on the operating conditions or characteristics of the battery/cell). For example, when the control circuitry detects or determines one or more events (for example, one or more parameters or operating characteristics are out-of-limits (for example, the partial relaxation time, overpotential and/or full relaxation time is outside of the predetermined limits), the control circuitry may "trigger" issuance of a calibration packet and/or adjust (for example, increase) a ratio of calibration packet to charge packets. In response to evaluation of the response of the battery/cell to the calibration packet(s), control circuitry 16 may adapt, adjust and/or control the amount of charge injected into the battery/cell (for example, change, adjust, control and/or vary the charging current signal(s), including the characteristics thereof (including, for example, shape of charge and/or discharge signal (if any), amplitude thereof, duration thereof, duty cycle thereof and/or rest period (if any) of a charge packet and/or discharge packet. Notably, the inventions directed to adaptive charging techniques and/or circuitry which adjust and/or control the amount of charge injected into the battery/cell may employ any technique and/or circuitry, whether now known or later developed, including those described and illustrated in PCT Patent Application PCT/US2012/0030618 and U.S. patent application Ser. No. 13/366,352. All such circuitry and techniques are intended to fall within the scope of the present inventions.

As noted above, the calibration packets are comprised of one or more charge pulses, discharge pulses and/or rest periods—in a known and fixed temporal relationship wherein the characteristics of the one or more charge and discharge pulses (for example, amplitude and widths of the pulses), and/or rest periods (for example, temporal location and length) are predetermined and/or fixed. In one embodiment, the temporal relationship and the characteristics of the one or more charge pulses, discharge pulses and/or rest periods of calibration packets are predetermined and/or fixed over or in accordance with two or more ranges of the SOC of the battery/cell. For example, in one embodiment, the calibration packets may include (i) a first temporal relationship, first compilation of pulse(s) and rest period(s), and a first set of characteristics of such pulse(s) and rest period(s) when the SOC of the battery/cell is 0-25%, (ii) a second temporal relationship, first compilation of pulse(s) and rest period(s), and a second set of characteristics of such pulse(s) and rest period(s) when the SOC of the battery/cell is 25-75%, and (iii) a third temporal relationship, third compilation of pulse(s) and rest period(s), and a third set of characteristics of such pulse(s) and rest period(s) when the SOC of the battery/cell is 75-100%.

In another embodiment, the temporal relationship and/or the characteristics of the one or more charge pulses, discharge pulses and/or rest periods of calibration packets may be a function of SOH and/or the ranges of the SOC of the battery/cell may be a function of SOH. In this embodiment, control circuitry 16 may control the characteristics of the calibration packets in accordance with two or more ranges of the SOH of the battery/cell and/or two or more ranges of the SOC of the battery/cell. Here, control circuitry 16 may adjust the temporal relationship and the characteristics of the one or more charge pulses, discharge pulses and/or rest periods of calibration packets that are fixed over or in accordance with two or more ranges of the SOH and/or SOC of the battery/cell. Indeed, all combinations or permutations thereof are intended to fall within the scope of the present inventions.

Thus, in this aspect of the present inventions control circuitry implements an adaptive charging technique for a battery/cell wherein one or more calibration packets (which are employed by control/measurement circuitry to detect, determine and/or measure, in situ, one or more characteristics and/or operating conditions of the battery/cell) are temporally integrated (for example, periodically—for example, at 1%, 5% or 10% increments of SOC during/over an entire charge sequence, or portion thereof, and/or aperiodically) within an adaptive charging sequence which includes charge packets (and may also include discharge packets). The charge packets (and discharge packets, if any) may be modified or adapted in accordance with the response of the battery/cell to the calibration packets in the charging sequence. For example, based on a measured response of the battery/cell to one or more calibration packets within the charging sequence, the circuitry and techniques of the present inventions may change, modify, adjust, control and/or vary the charging current signal (s), including the characteristics thereof (including, for example, shape of charge and/or discharge signal (if any), amplitude thereof, duration thereof, duty cycle thereof and/or rest period (if any)), applied to the terminals of the battery/cell. The calibration packets, however, are comprised of one or more charge pulses, discharge pulses and/or rest periods—in a predetermined, known and/or fixed temporal relationship wherein the characteristics of the one or more charge and discharge pulses (for example, amplitude and widths of the pulses), and/or rest periods (for example, temporal location and length) are predetermined and/or fixed. That is, the control circuitry does not adapt the characteristics of the charge pulses, discharge pulses and/or rest periods of the calibration packets based on one or more characteristics and/or operating conditions of the battery/cell.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions. Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, the correlation of (i) an SOH of the battery/cell, (ii) a partial relaxation time voltage, and (iii) a temperature of the battery/cell may be calculated or determined by circuitry and/or processes of the present inventions or by other circuitry and processes (for example, circuitry which is "off-device", "off-chip" or separate from the circuitry of the present inventions). The correlation data or mathematical relationship may be stored in memory (for example, in a database or look-up table) during manufacture, test or calibration and accessible to the circuitry and/or processes of the present inventions during operation.

Further, the control circuitry (and techniques implemented thereby) may employ the determined or estimated temperature and/or SOH to adapt the charge or recharging sequence (for example, change, adjust, control and/or vary the charging current signal(s), including the characteristics thereof (including, for example, shape of charge and/or discharge signal (if any), amplitude thereof, duration thereof, duty cycle thereof and/or rest period (if any)), applied to the terminals of the battery/cell, operation or cycle. (See, for example, the techniques and circuitry described and illustrated in PCT Patent Application PCT/US2012/0030618 and U.S. patent application Ser. No. 13/366,352, both of which are incorporated by reference). For example, the control circuitry may monitor and/or determine the partial relaxation time voltage ($V_{PRT}$) and temperature and responsively adapt the characteristics of the charging sequence (for example, the amount of charge, length and relative location of rest periods, the amplitude of the charge pulses, the duration or width of the charge pulses and/or shape of the charge pulses of the charge packets) to control one or more (or all) of such parameters. The present inventions are neither limited to any combination and/or permutation of such monitoring and/or adaptation. Indeed, the control circuitry may employ such techniques and/or control such parameters in any combination; all combinations or permutations thereof are intended to fall within the scope of the present inventions.

Further, although several of the exemplary embodiments are described and/or illustrated in the context of circuitry and/or techniques for a lithium ion technology/chemistry based battery/cell (for example, lithium-cobalt dioxide, lithium-manganese dioxide, lithium-nickel dioxide and lithium-iron phosphate), the inventions described and/or illustrated herein may also be implemented in conjunction with other battery or cell chemistries/technologies including, for example, nickel-cadmium and other nickel metal hydride chemistries/technologies and lead acid. As such, the embodiments set forth in the context of lithium ion based batteries/cells are merely exemplary; and other battery or cell chemistries/technologies, implementing one or more of the features of the present inventions as described herein, are intended to fall within the scope of the present inventions. It is to be understood that other embodiments may be utilized and operational changes may be made without departing from the scope of the present inventions. Indeed, the foregoing description of the exemplary embodiments of the inventions has been presented for the purposes of illustration and description. It is intended that the scope of the inventions not be limited solely to the description herein.

Further, as discussed herein, the control circuitry may intermittently, continuously and/or periodically estimate, calculate, measure and/or determine the temperature and/or SOH using the measured partial relaxation time voltage ($V_{PRT}$) in response to a calibration packet, as described herein. All permutations and combinations of charge packets and calibration packets are intended to fall within the scope of the present inventions. Indeed, such embodiments are applicable to the charging techniques and/or circuitry which apply or inject (i) charge and calibration packets having one or more charge pulses, (ii) charge and calibration packets having one or more charge pulses and one or more discharge pulses, (iii) discharge and calibration packets having one or more discharge pulses, and (iv) discharge and calibration packets having one or more charge pulses and one or more discharge pulses. In addition, the calibration packets also include one or more rest periods.

Further, as noted herein, control circuitry may perform or execute one or more applications, routines, programs and/or data structures that implement particular methods, techniques, tasks or operations described and illustrated herein. The functionality of the applications, routines or programs may be combined or distributed. In addition, the applications, routines or programs may be implementing by the control circuitry using any programming language whether now known or later developed, including, for example, assembly, FORTRAN, C, C++, and BASIC, whether compiled or uncompiled code; all of which are intended to fall within the scope of the inventions.

Moreover, monitoring circuitry and control circuitry may share circuitry with each other as well as with other elements. Moreover, such circuitry may be distributed among a plurality of integrated circuits which may also perform one or more other operations, which may be separate and distinct from that described herein.

Notably, at times, terms battery and cell have been employed interchangeably to mean an electrical storage device that may be electrically charged and discharged. Such a device may include a single electrical cell, or may include several cells electrically connected in series and/or parallel to form a battery of larger electrical capacity. It shall be noted that the embodiments for adaptive charging described herein shall apply to either cells or batteries, as a single unit or multiple units electrically configured into a larger battery pack.

Notably, a "circuit" means, among other things, a single component (for example, electrical/electronic) or a multiplicity of components (whether in integrated circuit form, discrete form or otherwise), which are active and/or passive, and which are coupled together to provide or perform a desired operation. In addition, "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

It should be further noted that the various circuits and circuitry disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the herein described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a fabrication process.

Moreover, the various circuits and circuitry, as well as techniques, disclosed herein may be represented via simulations using computer aided design and/or testing tools. The simulation of the charging circuitry, control circuitry and/or monitoring circuitry, and/or techniques implemented thereby, may be implemented by a computer system wherein characteristics and operations of such circuitry, and techniques implemented thereby, are imitated, replicated and/or predicted via a computer system. The present inventions are also directed to such simulations of the inventive charging circuitry, control circuitry and/or monitoring circuitry, and/or techniques implemented thereby, and, as such, are intended to fall within the scope of the present inventions. The computer-readable media corresponding to such simulations and/or testing tools are also intended to fall within the scope of the present inventions.

In the claims, partial relaxation time voltage ($V_{PRT}$) means the relationship (for example, difference) between (i) a terminal voltage of the battery/cell (i.e., a voltage measured at the terminals of the battery/cell) immediately prior to or at a beginning of a calibration packet (for example, immediately prior to or at a beginning of a charge or discharge pulse of the calibration packet) and (ii) (a) a terminal voltage, in response to a calibration packet, measured during the partial relaxation time period of a battery/cell, and/or (b) a peak voltage or substantial peak voltage (i.e., within 5-10% of the peak voltage of the battery/cell) measured during the partial relaxation time period of a response of the battery/cell to the calibration packet. The term "calculate" and other forms (i.e., calculating, calculated and calculation) in the claims means, among other things, calculate, assesses, determine and/or estimate and other forms thereof. Further, the term "battery" means an individual cell (which stores energy) and/or a plurality of cells arranged electrically in a series and/or parallel configuration. In addition, the terms "first," "second," and the like, herein do not denote any order, quantity, or importance, but rather are used to distinguish one element from another.

Moreover, the terms "a" and "an" herein do not denote a limitation of quantity, but rather denote the presence of at least one of the referenced item. Further, the term "data" may mean, among other things, a current or voltage signal(s) whether in an analog or a digital form (which may be a single bit (or the like) or multiple bits (or the like)).

What is claimed is:

1. A method to determine a temperature of a battery, wherein the battery includes at least two terminals, the method comprising:
    applying a first calibration packet to the terminals of the battery at a first state of charge (SOC) of the battery, wherein the first calibration packet includes a first pulse and a rest period, wherein the first pulse temporally precedes the rest period;
    measuring a plurality of voltages at the terminals of the battery, including:
        a first terminal voltage at a time immediately prior to or at a beginning of the application of the first pulse of the first calibration packet, and
        a second terminal voltage, in response to the first calibration packet, at a time during the partial relaxation time period of a battery;
    determining a partial relaxation time voltage ($V_{PRT}$) at the first SOC of the battery using the first and second terminal voltages; and
    determining a temperature of the battery by correlating the partial relaxation time voltage ($V_{PRT}$) at the first SOC of the battery to a temperature of the battery for the first SOC and a particular state of health (SOH) of the battery.

2. The method of claim 1 wherein the second terminal voltage is a peak voltage during the partial relaxation time period of the response of the battery to the first calibration packet.

3. The method of claim 1 wherein partial relaxation time period substantially coincides with the rest period of the first calibration packet.

4. The method of claim 1 wherein the second terminal voltage is a temporary steady state voltage during the partial relaxation time period of the response of the battery to the first calibration packet.

5. The method of claim 1 wherein determining the partial relaxation time voltage ($V_{PRT}$) at the first SOC of the battery using the first and second terminal voltages further includes subtracting (i) the second terminal voltage from the first terminal voltage or (ii) the first terminal voltage from the second terminal voltage.

6. The method of claim 1 wherein the partial relaxation time period of the response of the battery to the first calibration packet temporally coincides or substantially coincides with the rest period of the first calibration packet.

7. The method of claim 1 further including:
    applying a second calibration packet to the terminals of the battery at a second SOC of the battery, wherein the second calibration packet includes (i) a pulse having the same amplitude and pulse width as the first pulse and (ii) a rest period, which temporally follows the pulse, having temporal duration which is the same as the temporal duration of the rest period of the first calibration packet;
    measuring a third terminal voltage at a time immediately prior to or at a beginning of the application of the pulse of the second calibration packet,
    measuring a fourth terminal voltage, in response to the second calibration packet, at a time during the partial relaxation time period of a battery;

determining a partial relaxation time voltage ($V_{PRT}$) at the second SOC of the battery using the third and fourth terminal voltages; and determining a temperature of the battery at the second SOC of the battery by correlating the partial relaxation time voltage ($V_{PRT}$) at the second SOC to a temperature of the battery at the second SOC and the particular state of health (SOH) of the battery.

8. The method of claim 1 wherein the first calibration packet includes a second pulse wherein the first pulse is a charge pulse and the second pulse is a discharge pulse.

9. The method of claim 8 wherein the first pulse temporally precedes the second pulse and the second pulse temporally precedes the rest period.

10. The method of claim 9 wherein the second terminal voltage is a peak voltage during the partial relaxation time period of the response of the battery to the first calibration packet.

\* \* \* \* \*